US009746655B2

(12) United States Patent
Wares et al.

(10) Patent No.: US 9,746,655 B2
(45) Date of Patent: Aug. 29, 2017

(54) LOCATING CONNECTORS AND METHODS FOR MOUNTING SOLAR HARDWARE

(71) Applicant: SUNPOWER CORPORATION, San Jose, CA (US)

(72) Inventors: Brian Wares, Berkeley, CA (US); Charles Almy, Berkeley, CA (US); Nicholas Barton, Richmond, CA (US)

(73) Assignee: SUNPOWER CORPORATION, San Jose, CA (US)

( * ) Notice: Subject to any disclaimer, the term of this patent is extended or adjusted under 35 U.S.C. 154(b) by 316 days.

(21) Appl. No.: 14/550,823

(22) Filed: Nov. 21, 2014

(65) Prior Publication Data

US 2015/0146315 A1    May 28, 2015

Related U.S. Application Data

(63) Continuation of application No. 12/977,001, filed on Dec. 22, 2010, now Pat. No. 8,893,713.

(51) Int. Cl.
| *G02B 19/00* | (2006.01) |
| *H01L 31/0525* | (2014.01) |
| *F24J 2/52* | (2006.01) |
| *H01L 31/054* | (2014.01) |

(52) U.S. Cl.
CPC ........ *G02B 19/0042* (2013.01); *F24J 2/5232* (2013.01); *G02B 19/0023* (2013.01); *H01L 31/0525* (2013.01); *H01L 31/0547* (2014.12); *Y02E 10/47* (2013.01); *Y02E 10/52* (2013.01); *Y10T 29/49945* (2015.01)

(58) Field of Classification Search
CPC ...................................................... Y02E 10/44

USPC .................. 359/853; 126/684, 571, 685, 680
See application file for complete search history.

(56) References Cited

U.S. PATENT DOCUMENTS

| 4,153,474 A | 5/1979 | Rex |
| 4,222,368 A | 9/1980 | Rost et al. |
| 4,323,719 A | 4/1982 | Green |
| 4,373,783 A | 2/1983 | Anderson |
| 4,398,802 A * | 8/1983 | Auger ...................... F24J 2/542 126/696 |
| 4,429,178 A | 1/1984 | Prideaux et al. |
| 4,456,332 A | 6/1984 | Anderson |
| 4,468,848 A | 9/1984 | Anderson et al. |
| 4,468,849 A | 9/1984 | Anderson et al. |

(Continued)

FOREIGN PATENT DOCUMENTS

| CN | 2864493 | 1/2007 |
| CN | 101187724 | 5/2008 |

(Continued)

OTHER PUBLICATIONS

Supplementary European Search Report issued Feb. 23, 2015 in European Patent Application No. 11850716.9, 9 pages.

(Continued)

*Primary Examiner* — Avinash Savani
(74) *Attorney, Agent, or Firm* — Oblon, McClelland, Maier & Neustadt, L.L.P.

(57) ABSTRACT

A solar concentrator assembly can include mirror assemblies that are connected to pivotable frames with locating connections. The locating connections can be in the form of cam devices or tool-less connections formed by snap fitting devices as well as tool-less cam devices.

15 Claims, 16 Drawing Sheets

(56) References Cited

U.S. PATENT DOCUMENTS

| | | |
|---|---|---|
| 4,481,378 A | 11/1984 | Lesk |
| 4,502,200 A | 3/1985 | Anderson et al. |
| 4,640,734 A | 2/1987 | Roberts et al. |
| 4,643,543 A | 2/1987 | Mohn et al. |
| 4,643,544 A | 2/1987 | Loughran |
| 4,759,803 A | 7/1988 | Cohen |
| 4,832,001 A | 5/1989 | Baer |
| 4,995,377 A * | 2/1991 | Eiden ............... F24J 2/5431 126/605 |
| 5,180,441 A | 1/1993 | Cornwall et al. |
| 5,248,346 A | 9/1993 | Fraas et al. |
| 5,325,844 A | 7/1994 | Rogers et al. |
| 5,334,496 A | 8/1994 | Pond et al. |
| 5,344,496 A | 9/1994 | Stern et al. |
| 5,389,158 A | 2/1995 | Fraas et al. |
| 5,409,549 A | 4/1995 | Mori |
| 5,498,297 A | 3/1996 | O'Neill et al. |
| 5,580,395 A | 12/1996 | Yoshioka et al. |
| 5,616,185 A | 4/1997 | Kukulka |
| 5,660,644 A | 8/1997 | Clemens |
| 5,697,192 A | 12/1997 | Inoue |
| 5,865,905 A | 2/1999 | Clemens |
| 5,899,199 A | 5/1999 | Mills |
| 5,990,415 A | 11/1999 | Green et al. |
| 6,034,322 A | 3/2000 | Pollard |
| 6,131,565 A | 10/2000 | Mills |
| 6,323,478 B1 | 11/2001 | Fujisaki et al. |
| 6,359,209 B1 | 3/2002 | Glenn et al. |
| 6,442,937 B1 | 9/2002 | Stone |
| 6,553,729 B1 | 4/2003 | Nath et al. |
| 6,635,507 B1 | 10/2003 | Boutros et al. |
| 7,468,485 B1 | 12/2008 | Swanson |
| 7,554,031 B2 | 6/2009 | Swanson et al. |
| 7,709,730 B2 | 5/2010 | Johnson et al. |
| 7,820,906 B2 | 10/2010 | Johnson et al. |
| 7,825,327 B2 | 11/2010 | Johnson et al. |
| 7,932,461 B2 | 4/2011 | Johnson et al. |
| 7,952,057 B2 | 5/2011 | Finot et al. |
| 7,968,791 B2 | 6/2011 | Do et al. |
| 8,039,777 B2 | 10/2011 | Lance et al. |
| 8,049,150 B2 | 11/2011 | Johnson et al. |
| 8,071,930 B2 | 12/2011 | Wylie et al. |
| 8,083,362 B2 | 12/2011 | Finot et al. |
| 8,839,784 B2 | 9/2014 | Wares et al. |
| 8,893,713 B2 | 11/2014 | Wares et al. |
| 2002/0075579 A1 | 6/2002 | Vasylyev et al. |
| 2004/0074490 A1 | 4/2004 | Mills et al. |
| 2007/0151598 A1 | 7/2007 | De Ceuster et al. |
| 2007/0257274 A1 | 11/2007 | Martter et al. |
| 2008/0035198 A1 | 2/2008 | Teppe et al. |
| 2008/0314440 A1 | 12/2008 | Clemens et al. |
| 2009/0056699 A1 | 3/2009 | Mills et al. |
| 2009/0056785 A1 | 3/2009 | Johnson et al. |
| 2009/0056786 A1 | 3/2009 | Johnson et al. |
| 2009/0056787 A1 | 3/2009 | Johnson et al. |
| 2009/0056790 A1 | 3/2009 | Tian et al. |
| 2009/0095284 A1 | 4/2009 | Klotz |
| 2009/0139557 A1 | 6/2009 | Rose et al. |
| 2010/0071755 A1 * | 3/2010 | Kruse ............... F24J 2/525 136/251 |
| 2010/0154788 A1 | 6/2010 | Wells et al. |
| 2010/0163014 A1 | 7/2010 | Johnson et al. |
| 2010/0175740 A1 | 7/2010 | Johnson et al. |
| 2010/0193014 A1 | 8/2010 | Johnson et al. |
| 2010/0236626 A1 | 9/2010 | Finot et al. |
| 2010/0252030 A1 | 10/2010 | Marcotte et al. |
| 2010/0294336 A1 | 11/2010 | Johnson et al. |
| 2010/0319682 A1 | 12/2010 | Klotz |
| 2011/0023940 A1 | 2/2011 | Do et al. |
| 2011/0132457 A1 | 6/2011 | Finot |
| 2011/0186130 A1 | 8/2011 | Finot et al. |
| 2011/0226309 A1 | 9/2011 | Do et al. |
| 2011/0226310 A1 | 9/2011 | Johnson et al. |
| 2011/0265869 A1 | 11/2011 | Finot et al. |
| 2011/0286121 A1 * | 11/2011 | Werner ............... F24J 2/14 359/872 |
| 2012/0160234 A1 | 6/2012 | Wares et al. |
| 2013/0265665 A1 * | 10/2013 | Clavelle ............... G02B 5/10 359/853 |

FOREIGN PATENT DOCUMENTS

| | | |
|---|---|---|
| DE | 10041271 | 3/2002 |
| DE | 100 54 349 A1 | 5/2002 |
| DE | 202 05 349 U1 | 8/2002 |
| DE | 202004005198 | 8/2004 |
| DE | 10 2006 041 647 A1 | 3/2008 |
| DE | 20 2007 006 094 U1 | 10/2008 |
| DE | 20 2008 015 237 U1 | 3/2009 |
| ES | 1 071 351 | 10/2009 |
| GB | 2340993 | 3/2000 |
| JP | 2007184542 | 7/2007 |
| JP | 2007194521 | 8/2007 |
| JP | 2007214247 | 8/2007 |
| KR | 10-2007-0044333 A | 4/2007 |
| KR | 1020070070183 | 7/2007 |
| KR | 10-2008-0077814 A | 8/2008 |
| KR | 1020090014153 | 2/2009 |
| WO | WO 99/57493 A1 | 11/1999 |
| WO | WO 00/12839 | 3/2000 |
| WO | WO 02/097341 | 12/2002 |
| WO | WO 2007/096157 | 8/2007 |
| WO | WO 2007/096158 A1 | 8/2007 |
| WO | WO 2008/022409 A1 | 2/2008 |
| WO | WO 2008/153922 A1 | 12/2008 |
| WO | WO 2009/023063 | 2/2009 |
| WO | WO 2009/029275 | 3/2009 |
| WO | WO 2009/029277 | 3/2009 |
| WO | WO 2010/054617 A2 | 5/2010 |

OTHER PUBLICATIONS

Australian Patent Examination Report No. 1, issued Mar. 25, 2014, Australian Patent Application No. 2011349630, 3 pages.

Chinese First Office Action issued Nov. 4, 2014, Chinese Patent Application No. 201180017301.X, Sep. 29, 2012, 16 pages.

Bardwell, Karen et al., "Minimizing End Shadowing Effects on Parabolic Concentrator Arrays," IEEE, 1980, pp. 765-770.

Carroll, Don et al. "Production of the Alpha Solarco Proof-of-Concept Array," IEEE, 1990, pp. 1136-1141.

Edenburn, Michael W., et al. "Shading Analysis of a Photovoltaic Cell String Illuminated by a Parabolic Trough Concentrator," IEEE, 1981, pp. 63-68.

International Search Report and Written Opinion dated Aug. 27, 2012, received in PCT/US2011/065424, in 9 pages.

Quagan, Robert J., "Laser Diode Heat Spreaders," Ion Beam Milling, Inc., website copyright 2010, http://www.ionbeammilling.com/default.asp, 9 pgs.

Shepard, Jr., N. F. et al., "The Integration of Bypass Diodes with Terrestrial Photovoltaic Modules and Arrays," IEEE, 1984, pp. 676-681.

Stern, T. G., "Interim results of the SLATS concentrator experiment on LIPS-II (space vehicle power plants)," Photovoltaic Specialists Conference, 1988., Conference Record of the Twentieth IEEE, vol., No., pp. 837-840 vol. 2, 1988. URL: http://ieeexplore.ieee.org/stamp/stamp.jsp?tp=&arnumber=105822&isnumber=3239.

Vivar Garcia, Marta, "Optimisation of the Euclides Photovoltaic Concentrator," 2009, 390 pages.

Supplementary European Search Report issued Mar. 4, 2015 in European Patent Application No. 11850627.8, 10 pages.

\* cited by examiner

US 9,746,655 B2

LOCATING CONNECTORS AND METHODS FOR MOUNTING SOLAR HARDWARE

CROSS-REFERENCE TO RELATED APPLICATIONS

This application is a continuation of U.S. patent application Ser. No. 12/977,001, filed Dec. 22, 2010, entitled "LOCATING CONNECTORS AND METHODS FOR MOUNTING SOLAR HARDWARE," the contents of which are incorporated by reference herein in their entirety and for all purposes.

TECHNICAL FIELD

Embodiments of the subject matter described herein relate generally to solar concentrators. More particularly, embodiments of the subject matter relate to concentrator component connectors and methods for assembly.

BACKGROUND

Solar concentrators are different from unconcentrated solar panels in a number of ways, including challenges regarding weight distribution. Solar concentrator arrays are frequently mounted to, and have their position adjusted at, a central post or pier. Such concentrator arrays typically have a support structure with a lateral member, such as a crossbeam or strut. The lateral member is typically coupled directly to the post, usually by a positioning mechanism. In turn, several concentrator elements are coupled to the lateral member, and are supported by it.

As a consequence of the components' position above the lateral member, the center of gravity of the concentrator array is above the post, and, consequently, above the positioning mechanism. To maintain maximum performance of concentrator systems, the concentrators, typically in the form of trough-shaped mirrors configured to focus sunlight into a band-shaped focal plane, are driven to track the sun.

In some systems, efficiency can drop if the mirrors are misaligned by as little as 0.1°. Thus, high performance of such systems is more likely to be achieved if the components of the concentrator arrays are manufactured to precise tolerances. On the other hand, high precision components and complex, time consuming assembly procedures can adversely affect the economic feasibility of such systems.

BRIEF SUMMARY

An aspect of at least one of the inventions disclosed herein includes the realization that a locating connectors for concentrated solar collectors can provide both a high precision and a labor saving solutions for mounting solar concentrators to sun tracking frame systems.

Thus, in accordance with an embodiment, a solar energy concentrator can comprise a frame, at least one longitudinal trough-shaped mirror supported by the frame, and at least one connection device connecting the at least one longitudinal trough-shaped mirror to the frame, the connection device comprising at least one tool-less connection connecting the mirror to the frame when the tool-less connection is in an engaged state.

In accordance with another embodiment, a solar energy concentrator can comprise a frame, at least one longitudinal trough-shaped mirror supported by the frame, and a connection device configured to connect the at least one longitudinally trough-shaped mirror to the frame with a tool-less, self-locking fit when the mirror is moved toward the frame.

In accordance with yet another embodiment, a method of connecting a mirror of a concentrated solar reflector assembly can comprise connecting a first portion of a longitudinally extending trough-shaped mirror assembly from a first support disposed on a support frame. The mirror assembly can be moved such that a second portion of the mirror assembly that is spaced from the first portion is moved toward a snap fitting disposed on the support frame. Additionally, the method can include connecting the second portion to the snap fitting such that the mirror assembly is fixed to the support frame in a predetermined orientation.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
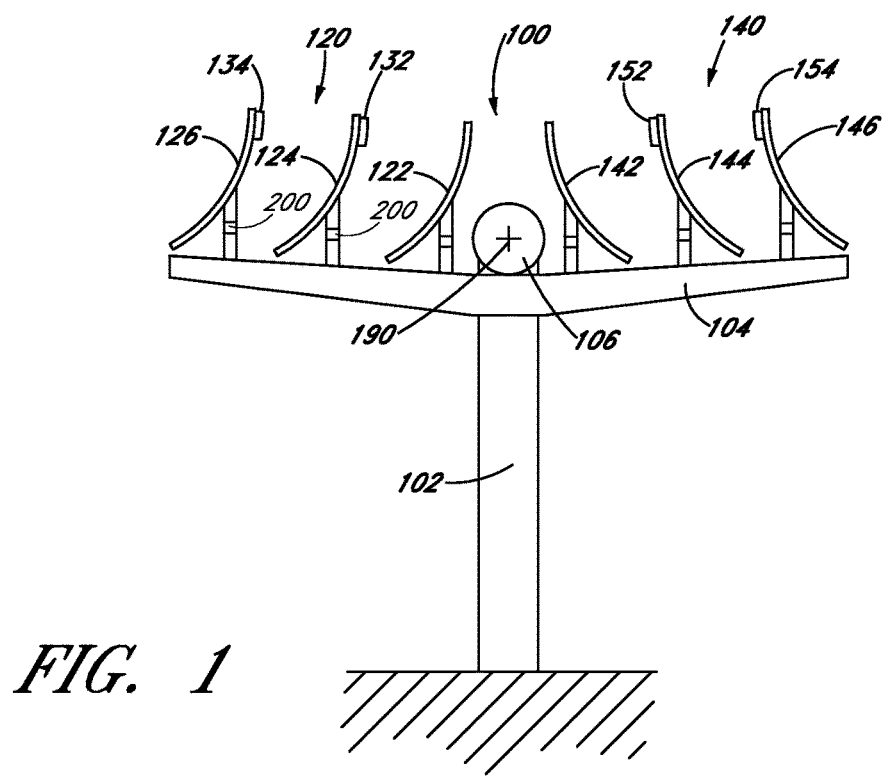
FIG. 1 is a side view of an embodiment of a solar concentrator system having an improved locating connector for mounting solar hardware.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature.

"Tool-less connection"—The following description refers to devices or features being connected with "tool-less connections". As used herein, unless expressly stated otherwise, "tool-less connection" means that one element/node/feature is directly or indirectly joined to (or directly or indirectly communicates with) another element/node/feature with a mechanism that can be operated by a human without any tools or other separate parts to achieve a joined state and optionally to be disconnected from the joined state.

"Locating connector"—The following description refers to devices or features being connected with a "locating connector". As used herein, unless expressly stated otherwise, "locating connector" means that one element/node/feature is directly or indirectly joined to (or directly or indirectly communicates with) another element/node/feature with a mechanism that connects and also provides a locating function, such as for example but without limitation, alignment of elements/nodes/features or enhancing contact between two elements/nodes/features.

"Adjust"—Some elements, components, and/or features are described as being adjustable or adjusted. As used herein, unless expressly stated otherwise, "adjust" means to position, modify, alter, or dispose an element or component or portion thereof as suitable to the circumstance and embodiment. In certain cases, the element or component, or portion thereof, can remain in an unchanged position, state, and/or condition as a result of adjustment, if appropriate or desirable for the embodiment under the circumstances. In some cases, the element or component can be altered, changed, or modified to a new position, state, and/or condition as a result of adjustment, if appropriate or desired.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

The inventions disclosed herein are described in the context of a solar concentrator array. However, these inventions can be used in other contexts as well. A solar energy concentrator is disclosed, the solar energy concentrator comprising a frame, at least one edge solar receiver supported by the frame, and at least one connection device connecting the at least one edge solar receiver to the frame, the connection device comprising at least one tool-less connection connecting the edge solar receiver to the frame when the tool-less connection is in an engaged state. Another embodiment of a solar energy concentrator is disclosed, the solar energy concentrator comprising a frame, an edge solar receiver supported by the frame, and connection means for connecting the edge solar receiver to the frame with a tool-less, self-locking fit when the mirror is moved toward the frame. A method of connecting an edge solar receiver of a concentrated solar reflector assembly is also disclosed. The method comprises connecting a first portion of a longitudinally extending edge solar receiver assembly from a first support disposed on a support frame, moving the edge solar receiver assembly such that a second portion of the edge solar receiver assembly that is spaced from the first portion is moved toward a snap fitting disposed on the support frame, and connecting the second portion to the snap fitting such that the edge solar receiver assembly is fixed to the support frame in a predetermined orientation.

Figure 2:
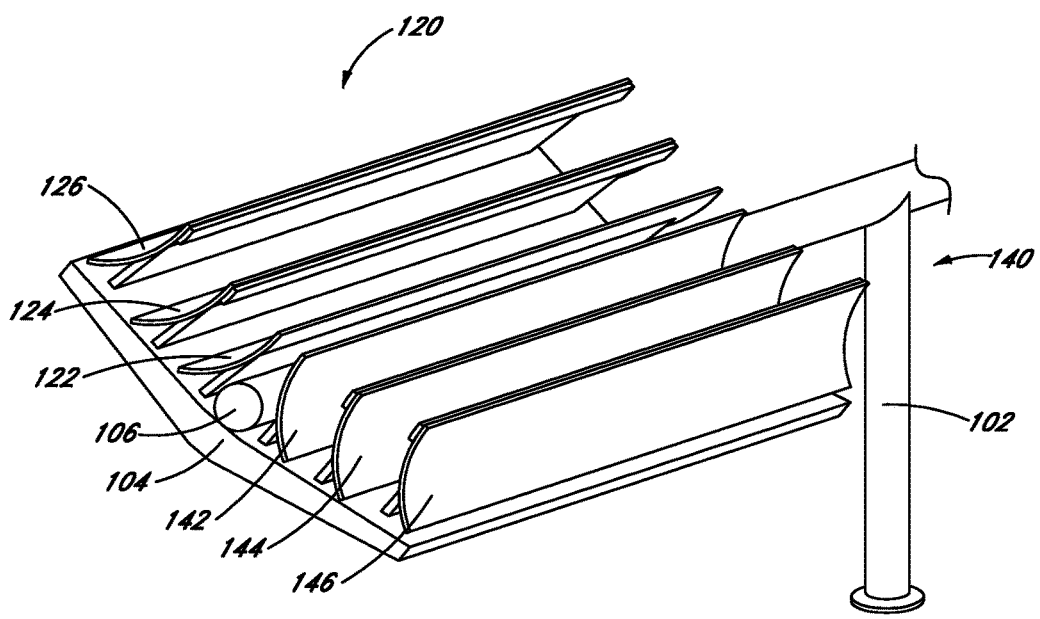
FIG. 2 is a perspective view of the solar concentrator system of FIG. 1.

FIGS. 1 and 2 illustrate an embodiment of a solar concentrator array or assembly 100. The drawings contained herein are for descriptive purposes and may not be to scale. Certain features may be exaggerated for explanation. The solar concentrator assembly 100 comprises a pier or post 102 which supports a crossbeam 104 and torque tube 106.

The crossbeam 104 in turn supports first and second groups of concentrator elements 120, 140 supported by the crossbeam 104 with locating connectors 200, described in greater detail below with reference to FIGS. 3-24.

In the illustrated embodiment, the first group of concentrator elements 120 face in one direction, and the second group of concentrator elements 140 are positioned facing the opposite direction, with the changeover between them occurring at the torque tube 106. Certain elements are shown, while others are omitted for clarity and descriptive purposes, as will be explained in greater detail below.

The post 102 can be a single post or one of several supporting the solar concentrator assembly. The post 102 is preferably anchored within a foundation in the ground to support it. The post 102 can be a solid or hollow member of sufficient size and cross-sectional characteristics to support the solar concentrator assembly 100. The post 102 can be formed of a metal, such as steel, aluminum, and similar high-strength metals, or alternative material. For example, concrete or ceramic can be used in some embodiments, as desired.

When groups of concentrator elements are positioned laterally adjacent each other to extend the solar concentrator assembly 100, multiple posts 102 can be used, spaced appropriately, to support the entire arrangement. Thus, although only one group of concentrator elements is shown facing each direction in FIGS. 1 and 2, more groups can be positioned along the torque tube 106, extending the solar concentrator assembly 100. Posts 102 can be positioned between every concentrator element group or spaced further apart, as desired.

The crossbeam 104 is supported by the post 102 and torque tube 106. The crossbeam 104 can have a substantially horizontal shape, which can include an upwardly-angled portion for positioning individual concentrator elements. The crossbeam 104 can be one of several crossbeams or cross-pieces which support a given concentrator element group. Thus, although one crossbeam 104 is shown, several lateral members can support a single concentrator element successively along the torque tube 106. The crossbeam is preferably made from a high-strength metal such as steel, although other materials can be used, as desired.

The rotational member, or torque tube 106, can be mounted to, and supported by, the post 102. The torque tube 106 is preferably mounted by or to a bearing or bushing or other assembly permitting rotation of the torque tube 106 along its long axis. In some embodiments, a motor or other driving device can be situated between the post 102 and torque tube 106 to adjust the position of the torque tube 104, and correspondingly, the position of the concentrator element groups 120, 140. The torque tube 106 is preferably a hollow tube with a circular cross-section, although other shapes and geometries can be used if preferred, including elliptical or solid shafts. The torque tube 106 has a long axis extending along its length. The long axis extends through the center of the cross-section of the torque tube 106 and the torque tube rotates around it.

The torque tube 106 can extend through multiple concentrator element groups, including extending substantially entirely along the width of the concentrator elements, either as a unitary piece or by coupling together similar tubes. Thus, although the torque tube 106 is shown with two concentrator element groups 120, 140, there can be other element groups adjacent these, up to an appropriate limit. The torque tube 106 preferably can support the weight of the crossbeam 104 and concentrator element groups 120, 140 with minimal elastic or inelastic deforming, thereby inhibiting alignment error into the solar concentrator assembly 100. The torque tube 106 is preferably rigidly mounted to the crosspieces, including crossbeam 104, such that rotating the torque tube 106 around its long axis similarly rotates the crosspieces.

The solar concentrator element groups 120, 140, can be directly or indirectly, coupled to and supported by the crossbeam 104 and torque tube 106, with locating connectors 200, described in greater detail below. The first concentrator element group 120 is composed of the first, second, and third concentrator elements 122, 124, 126. The second concentrator group 140 is composed of fourth, fifth, and sixth concentrator elements 142, 144, 146. Each concentrator element 122, 124, 126, 142, 144, 146 has a front, reflective side and a rear side.

The reflective side can be, or can include, a mirror shaped according to the geometric characteristics of the concentrator/receiver combination to provide concentrated sunlight on the solar receiver, along a focal band. The concentrator elements 122, 124, 126, 142, 144, 146 receive unconcentrated sunlight and reflect it to a solar receiver, while concentrating it to a smaller area than the reflective surface. Preferably, the concentrator elements 122, 124, 126, 142, 144, 146 have a parabolic shape, as shown, although other shapes can be used.

For descriptive purposes, certain aspects of the solar concentrator assembly 100 are illustrated not entirely to scale, in a different position, or in a different orientation than they may appear in certain embodiments. For example, concentrator elements 122, 142 are illustrated with a greater vertical position than might be the case in some embodiments. Thus, in certain embodiments, the concentrator elements 122, 142 may extend substantially entirely over the torque tube 106, thereby reducing the amount of sunlight which falls between them and increasing the amount captured by the concentrator elements 122. Similarly, all concentrator elements 122, 124, 126, 142, 144, 146 can have such different orientations.

The first concentrator element 122 reflects concentrated sunlight to the first solar receiver 132. The second concentrator element 124 reflects concentrated sunlight to the second solar receiver 134. The third concentrator element 126 can also direct concentrated sunlight to a receiver mounted on the crossbeam 104, although it has been omitted for clarity. Similarly, the fourth and fifth concentrator elements 142, 144 can direct concentrated sunlight to the third and fourth solar receivers 152, 154, with the solar receiver corresponding to the sixth concentrator element 146 omitted for clarity. The omitted solar receivers corresponding to the third and sixth concentrator elements 126, 146 can be positioned at heights and in orientations necessary to cooperate with certain techniques described herein. Thus, the offset for the omitted receivers can correspond to the offset between the first and second solar receivers 132, 134 in a concentrator row.

Each solar receiver 132, 134, 152, 154 can be mounted to the rear side of a concentrator element, as shown. The solar receivers 132, 134, 152, 154 can comprise a photovoltaic solar cell, diode, interconnect, thermal adhesive, heat spreading device, encapsulant, frame, junction box and/or micro-inverter, and other components as appropriate or desired for efficiently converting received concentrated sunlight to power, including electrical power. In some embodiments, the solar receivers can comprise back-contact, back junction solar cells, while in others, front-contact or other cells can be used. In certain embodiments, the solar receivers 132, 134, 152, 154 can be supported independently from the concentrator elements, such as by a support assembly coupled to the crossbeam 104.

Each solar receiver 132, 134, 152, 154 is preferably coupled to a concentrator element in a position such that reflected, concentrated sunlight impinges it at a predetermined angle. It is desirable that the incoming concentrated sunlight impinges at a 90° angle to the surface of the solar receiver 132, 134, 152, 154. Thus, each solar receiver is preferably mounted in such a position that the surface of each solar receiver 132, 134, 152, 154 is at a right angle, or as nearly a right angle as practicable, to the anticipated angle of impinging concentrated sunlight from each concentrator element 122, 124, 126, 142, 144, 146, as will be explained in greater detail below.

Because the solar concentrator assembly 100 operates most efficiently when the maximum available sunlight is received by the concentrator elements 122, 124, 126, 142, 144, 146, the torque tube 106 can be rotated during daily operation to adjust the position of the crossbeam 104 and other cross-pieces. This in turn changes the orientation of the concentrator elements 122, 124, 126, 142, 144, 146, which can be positioned to advantageously and desirably receive as much sunlight as possible.

U.S. patent application Ser. No. 12/849,604, filed Aug. 3, 2010 discloses other embodiments of the solar concentrator assembly 100, identified by the reference numerals 200 and 300 with which the present inventions can be used. The entirety of the descriptions of all of the various embodiments of the solar concentrator assemblies disclosed in the '604 application are hereby expressly incorporated by reference.

Figure 3:
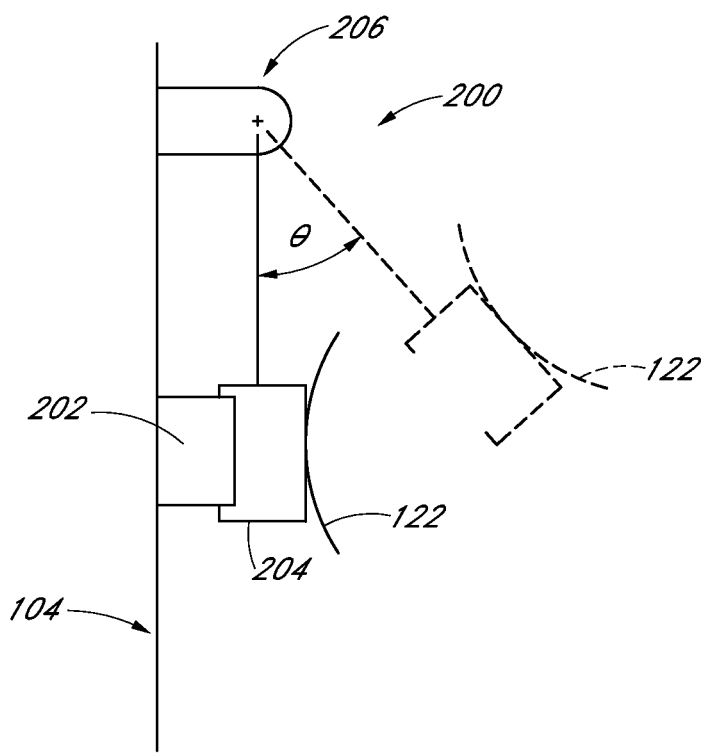
FIG. 3 is a schematic diagram of an embodiment of a solar concentrator connector mechanism, the solid line orientation being a connected state and the dashed line orientation being a disconnected state.

With reference to FIG. 3, as noted above, the solar concentrator assembly 100 can include a locating connectors 200 for connecting the concentrator element 122 to a cross beam 104. The locating connectors can include a first connection element 202 mounted to the cross beam 104 and a second connection element 204 mounted to the concentrator element 122. In some embodiments, the first and second connection elements 202, 204 can be configured to releasably engage each other without the need for any tools and thereby function as a tool-less connector. Optionally, the first and second connection elements 202, 204 can also be configured to be released from each other without the use of any tools.

In some embodiments, the locating connector 200 can also include a pivot connection 206 configured to define a pivot axis about which the concentrator element 122 can pivot, for example, through a range of pivot motion θ. More specifically, the pivot 206 can be configured to allow the concentrator element 122 to pivot between a disconnected state (illustrated in phantom line) and a connected state (illustrated in solid line). Thus, the concentrator element 122 can be moved from a first disconnected state, in a single direction, into a connected state (solid line). The technique of a locating connector and a pivot connector can be used with other components as well, including where the concentrator element 122 is replaced with the edge receiver.

The specific mechanisms and/or devices used to define the locating connectors 200 can be configured, as desired, to withstand the loads which may be applied to the concentrator elements 122.

Figure 4:
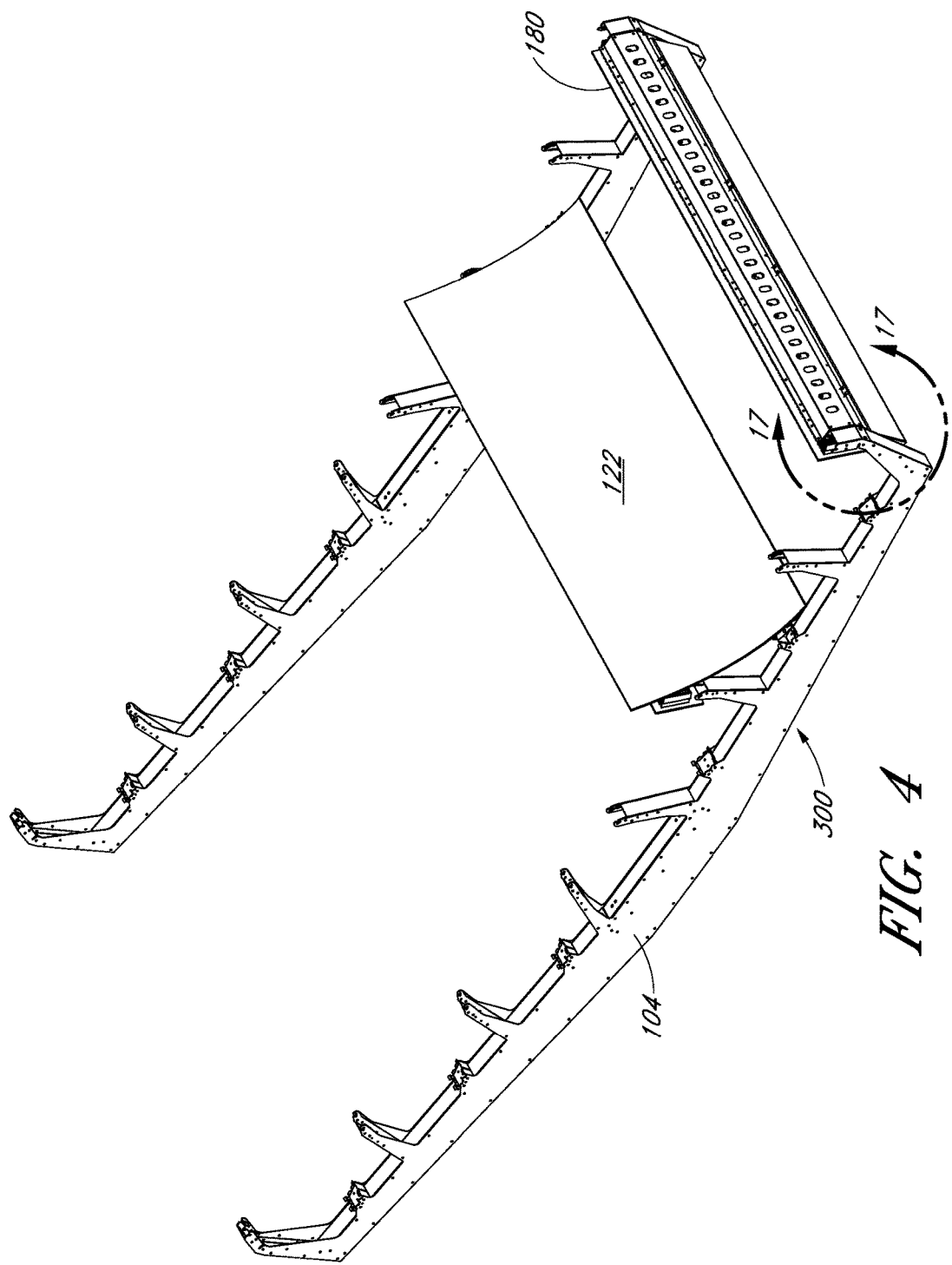
FIG. 4 is a perspective view of a solar concentrator system with a further embodiment of the connector mechanism illustrated in FIG. 3.

FIG. 4 illustrates a further non-limiting embodiment of the locating connector 200, identified by the numerical indicator numeral 300. Unless otherwise noted, the numerical indicators used in reference to locating connector 300 refers similar elements as in the locating connector 200 of FIG. 3, except that the number has been increased by 100.

Figure 17:
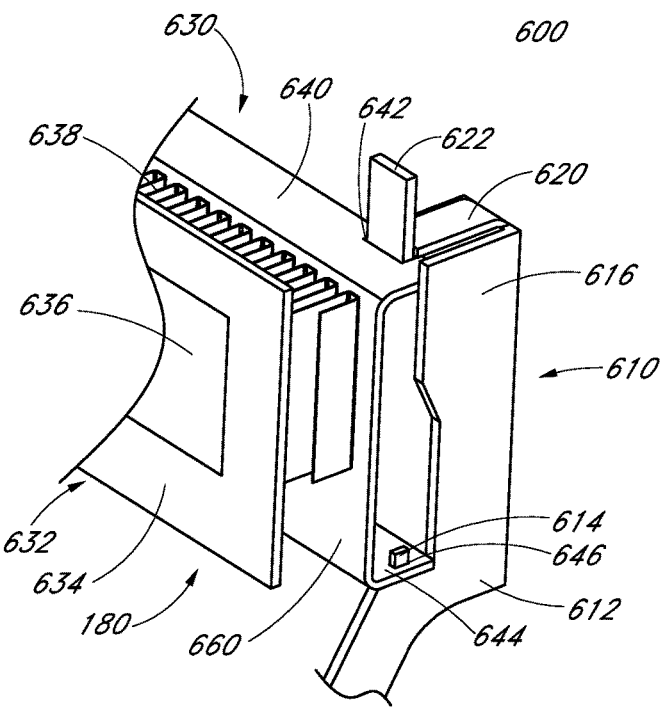
FIG. 17 is an enlarged side perspective view of the embodiment illustrated in FIG. 4, illustrating an edge receiver supported by a transverse cross beam with a tool-less connection.

With continued reference to FIG. 4, the locating connector 300 includes a snap connection formed by a first connection element 302 mounted to the cross member 104 and a second connection element 304 mounted to the concentrator element 122. Additionally, the locating connector 300 includes a pivot 306. Edge solar receiver 180 is positioned along the outer periphery of the solar concentrator assembly 100 with a second locating connector 600 (FIG. 17).

Figure 6:
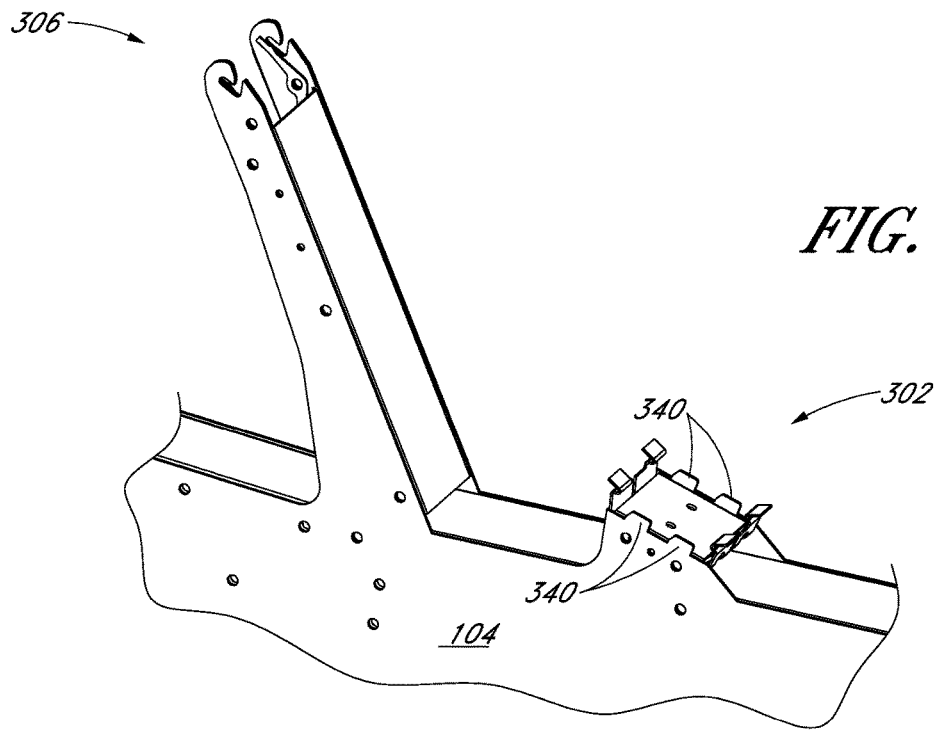
FIG. 6 is a further enlarged view of a portion of the tool-less connection illustrated in FIG. 5, with the solar collector removed.
Figure 7:
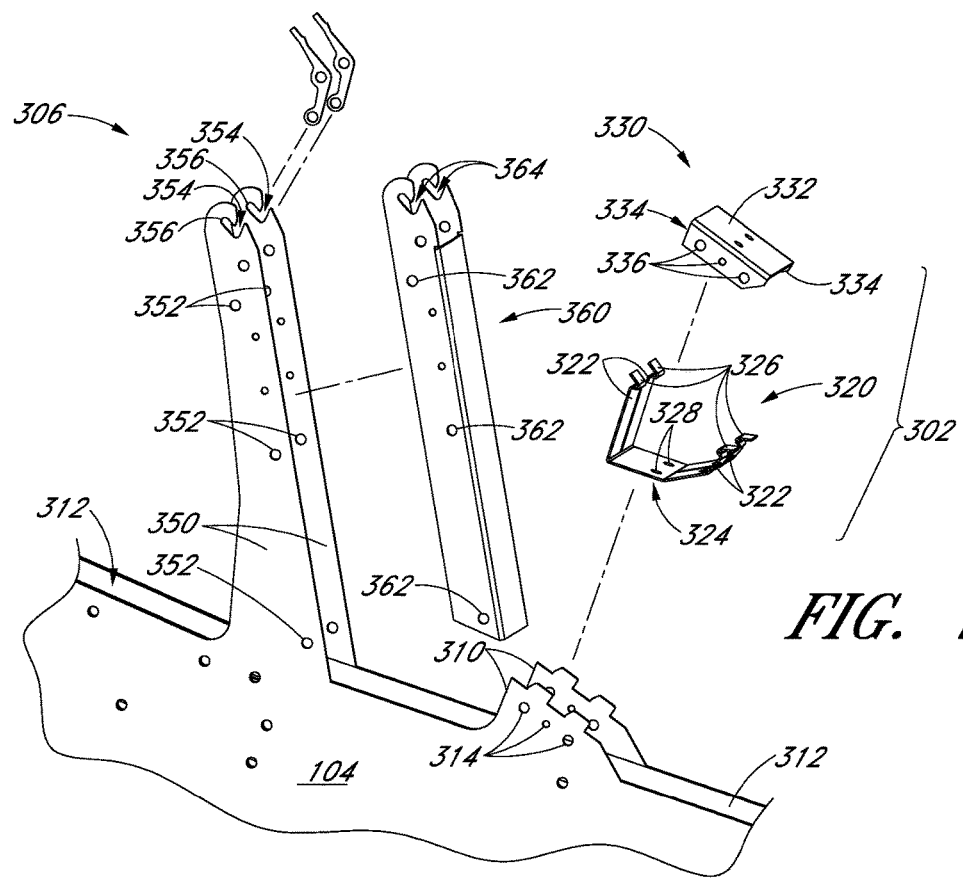
FIG. 7 is an exploded view of the tool-less connection illustrated in FIG. 6.

With reference to FIGS. 6 and 7, the first connection element 302 secured to the cross member 104 can be formed in one or a plurality of components connected together. In the illustrated embodiment, the first connection element 302 includes a pair of sidewalls 310 extending upwardly from an upper surface 312 of the cross member 104. The sidewalls 310 can include locating holes 314 which can be positioned for locating another component of the first connection element 302.

The first connection element 302 can also include a leaf spring member 320 configured to define at least one snapping element for generating a snap-type connection. In the illustrated embodiment, the leaf spring member 320 can include four leaf springs 322 secured to a common lower wall 324. Each of the leaf springs 322 can include an inward projection 326 configured to engage portions of the second connection element 304, described in greater detail below. Additionally, the lower common wall 324 can include locating holes 328 configured to be alignable with additional holes in the upper surface 312.

The first connection element 302 can also include an inner block member 330 configured to form a locating surface for the first connector element 302, to thereby cooperate in defining the secured position of the second connection element 304 when connected to the first connection element 302, thus providing a locating function. In the illustrated embodiment, the locating surface is defined by an upper surface 332 of the member 330.

The member 330 can also include sidewalls 334 which can also include locating holes 336 configured to be alignable with the locating holes 314 on the sidewalls 310. As such, a precise location of the member 330 can be defined by aligning the holes 336 with the holes 314, as illustrated in FIG. 6.

Optionally, as illustrated in FIG. 6, the first connection element 302 can also include longitudinal locating members 340. In the illustrated embodiment, the longitudinal locating projections 340 are defined by tabs extending upwardly from an upper edge of the sidewalls 310. However, the longitudinal locating projections can be formed with any type member having any shape. The above noted structure of the first connection element 302 is merely one exemplary configuration that can be used; other configurations can also be used With continued reference to FIGS. 6 and 7, the pivot 306 can be defined in any known manner. In the illustrated embodiment, the pivot 306 includes a pair of pivot sidewalls 350 extending from an upper surface 312 of the cross member 104. Additionally, the sidewalls can include a plurality of locating holes 352 for alignment purposed as desired.

At an upper end thereof, the sidewalls 350 include slots 354 which include closed ends 356. The closed end of the slots 356 can be configured to define a pivot axis, described in greater detail below. Additionally, the slots 354 can include an open end and a bend, configured to define a further pivot axis and/or a resting position for the collector concentrator assembly 122, also described in greater detail below.

In the illustrated embodiment, the pivot 306 can optionally be formed with a second reinforcing member 360. The reinforcing member 360 can have essentially the same shape as the sidewalls 350. In this embodiment, the reinforcing member 360 has a U-shaped cross section and is sized to extend over the sidewalls 350.

Alignment holes 362 on the reinforcement member 360 are positioned to be alignable with the alignment holes 352 of the sidewalls 350. Further, the reinforcement member 360 can include slots 364 having the same shape as the slot 354 of the sidewalls 350. As such, when secured in the orientation illustrated in FIG. 6, the reinforcing member 360 provides a reinforcement of the sidewalls 350. However, this is merely one exemplary configuration that can be used to define the pivot 306, other configurations can also be used. In certain embodiments of the sidewalls 350, a simple vertical post can be used in place of the slots 354. Some embodiments of the post can include a tapering shape, vertically tapering as it extends from the sidewalls 350.

Figure 8A:
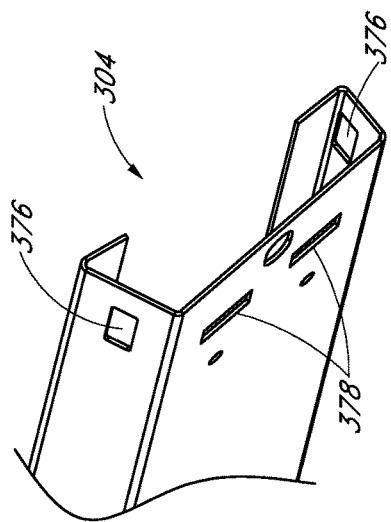
FIG. 8A is an enlargement of a longitudinal end of the lower stiffening member illustrated in FIG. 8.
Figure 8:
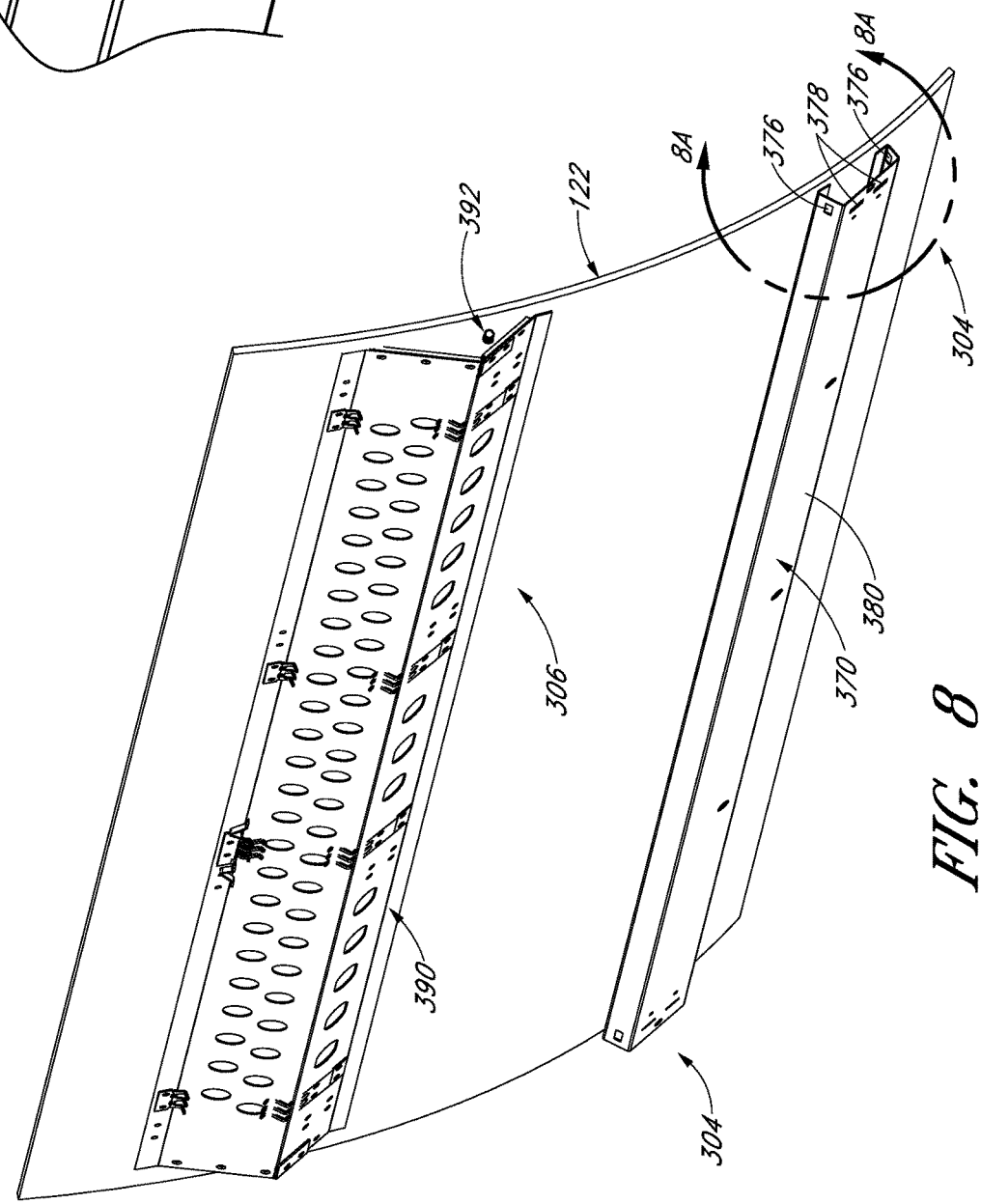
FIG. 8 is a perspective view of a mirror of the concentrated solar collector illustrated in FIG. 5, illustrating upper and lower stiffening members attached to the mirror which form parts of the tool-less connection.

With reference to FIGS. 8 and 8A, the second connection element 304 can be incorporated into a stiffening element 370. In the illustrated embodiment, this stiffening element 370 is essentially a channel of structural material, such as steel or aluminum, bonded to the concentrator element 122.

As shown in FIG. 8A, the longitudinal ends of the reinforcing member 370 include engagement recesses 376 configured to engage the protrusions 326 (FIG. 7) of the first connection element 302. Additionally, the second connection element 304 can also include locating recesses 378 configured to receive the tabs 340 (FIG. 6). Optionally, the stiffening member 370 can be sized such that a lower facing surface 380 abuts against the locating surface 332 (FIG. 7) of the first connection element 302 when in the engaged state.

With continued reference to FIG. 8, a portion of the pivot 306 can be incorporated into a second stiffening member 390 mounted to another portion of the concentrator element 122. In the illustrated embodiment, the stiffening member 390 has a triangular cross section and is also configured to provide a mounting assembly for the solar receiver 132 (FIG. 1). In the illustrated embodiment, a portion of the pivot 306 is defined by a pin 392 extending from each longitudinal end of the stiffening member 390. The pin 392 can be configured to form a tight fit with the closed end 356 (FIG. 7) of the slots 354, and thereby precisely define a pivot axis about which the concentrator element 122 can pivot, described in greater detail below. In certain embodiments, such as those where a vertical, tapering post is formed in place of slots 354 on the sidewall, the pin 392 can be replaced by a port or slot in the stiffening member 390 which can receive the post, thereby aligning the concentrator element 122 relative to the cross beam 104.

Optionally, the pivot 306 can also include a sprung contact member 366 configured to overlap a portion of the slot 364. Additionally, optionally, the member 366 can include a protrusion 368 to provide further positive contact between the member 366 and the pin 392. This can provide the further advantage of ensuring electrical contact member 366 and the pin 392 and therefore better ensure proper electrical grounding of such an assembly.

Figure 9:
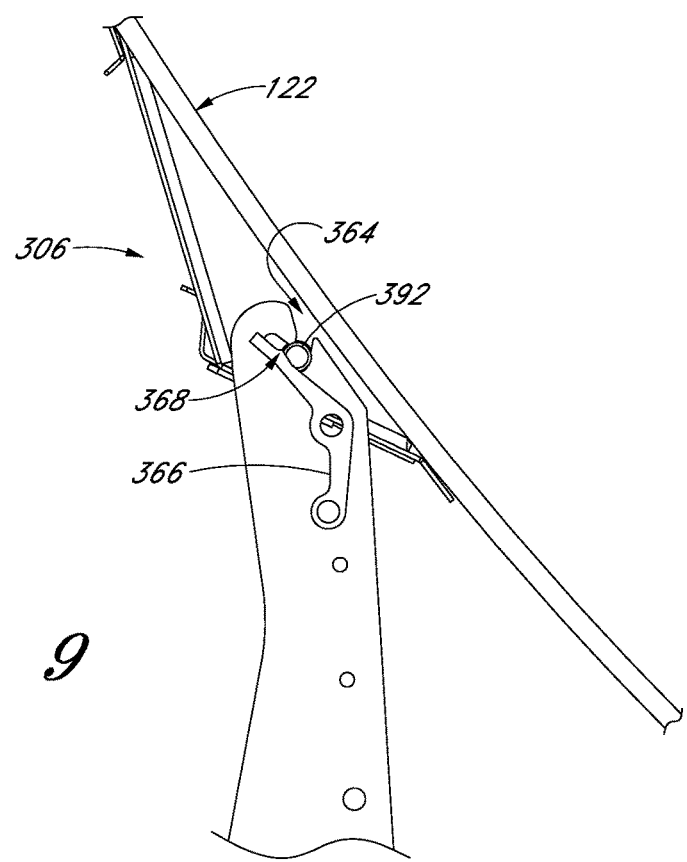
FIG. 9 is an enlarged side elevational view of the solar collector of FIG. 8 illustrating an intermediate connection state in which the concentrated solar collector hangs from a portion of the tool-less connection mechanism.

The orientation of the pivot 306 in FIG. 9 corresponds to a position in which the cross member 104 and torque tube 106 are rotated during assembly of the concentrator array 100. This orientation can allow a worker to assemble a concentrator 122 to the cross member 104 more conveniently.

For example, in the orientation illustrated in FIG. 9, a worker can lift the concentrator 122 and place the pin 392 into the slot 364. Because of the bent configuration of the slot 364, the concentrator 122 can rest in a first position, illustrated in FIG. 9, with the entire weight of the concentrator 122 supported by the slot 364. Thus, it is advantageous to configure the pivot 306 with sufficient strength to support the entire weight of the concentrator 122 and all of the components connected to it. As illustrated in FIG. 9, the mouth of the slot 364 can be wider than the rest of the slot, thereby allowing a worker to more easily insert the pin 392 into the slot 364. Additionally, once in this position, a worker can inspect the concentrator 122 to ensure proper alignment and connections with other components as well, such as for example, electrical connectors.

Figure 10:
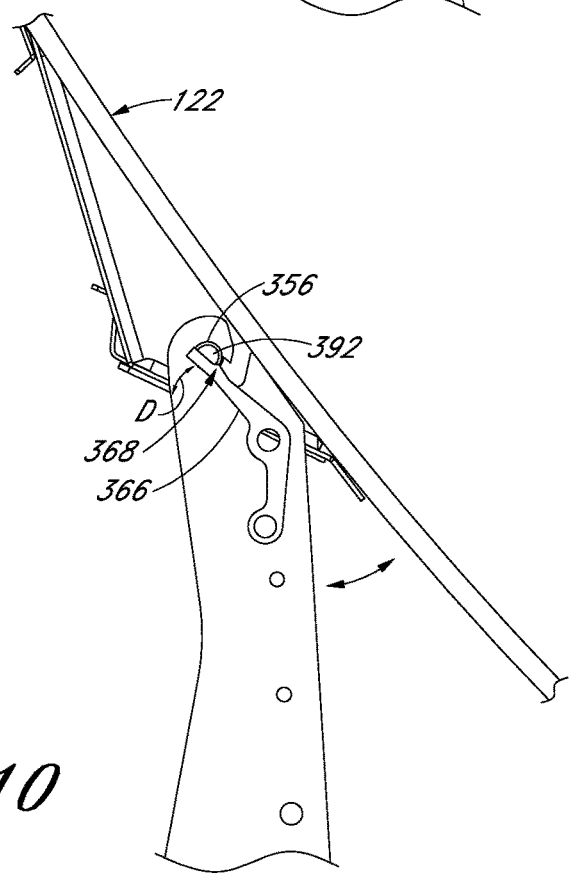
FIG. 10 is another enlarged side elevational view, with the concentrated solar collector pushed upwardly into a position in which it can pivot about a pivot axis between a connected and disconnected state.

With reference to FIG. 10, a worker can then shift the concentrator assembly element 122 upwardly, such that the pin 392 moves toward the closed end 356 of the slot 354. Additionally, this movement of the concentrator element 122 upwardly, deflects the contact member 366 as the pin 392 moves past the projection 368, then remains in a biased contacting state; the spring force creating a positively biased contact between the pin 392 and the member 366. More specifically, with the pin 392 secured in this position, the member 366 will be under constant elastic deflection and thus perpetually pressing against the pin 392 and thereby better maintaining an electrical connection, for example, by preventing gases such as oxygen from migrating into the area between the contact surfaces, and causing oxidation or other forms of corrosion.

Figure 5:
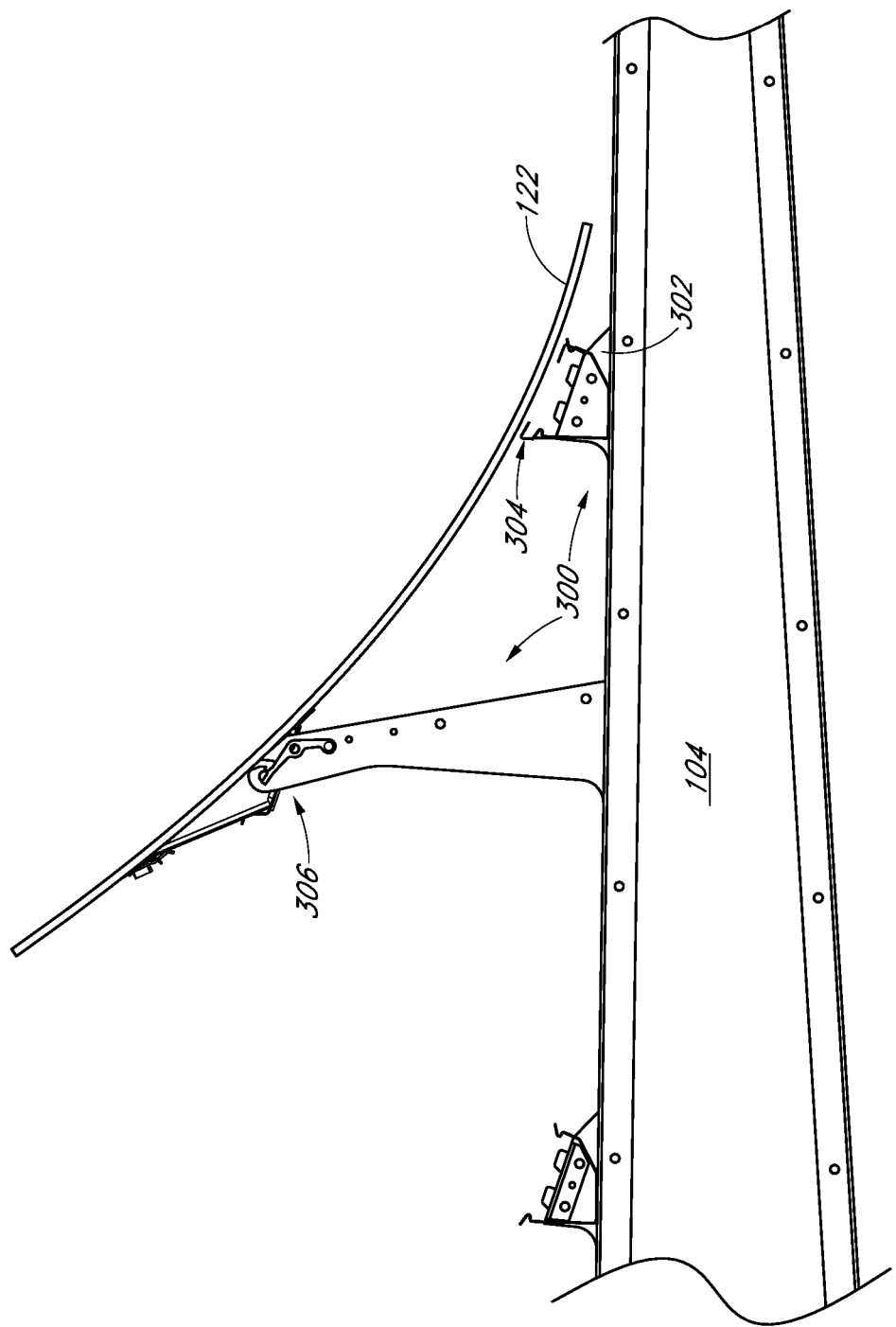
FIG. 5 is an enlarged side elevational view of the embodiment illustrated in FIG. 4, illustrating a concentrated solar collector supported by a transverse cross beam with a tool-less connection.
Figure 11:
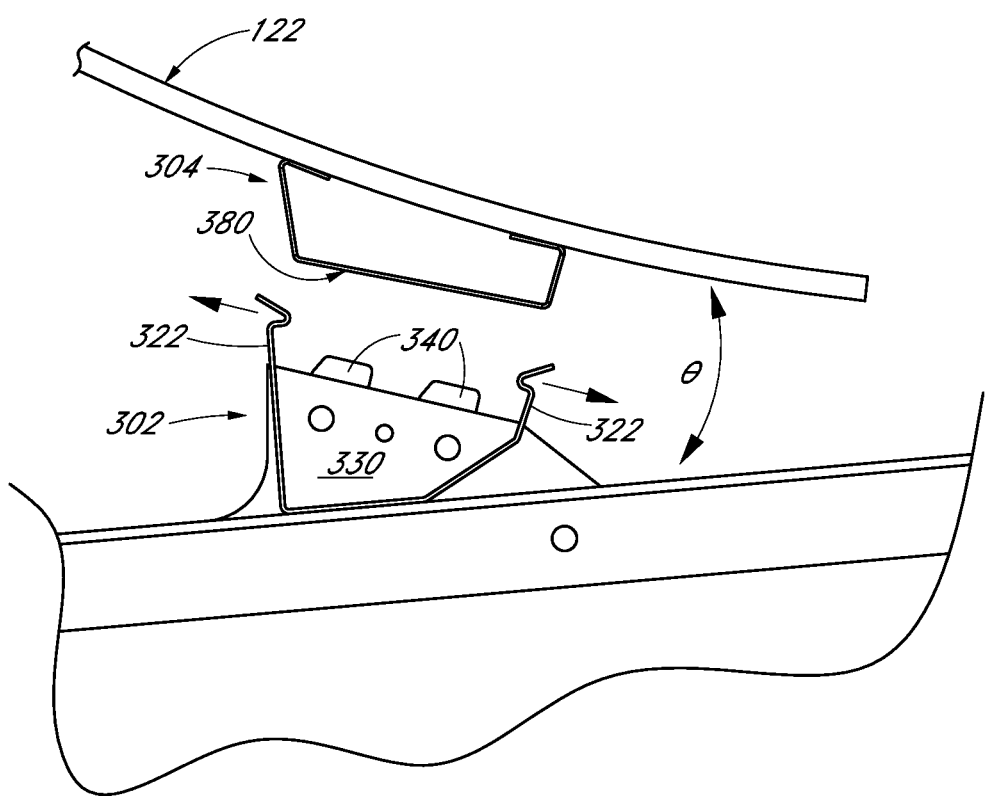
FIG. 11 is an enlarged side elevational view illustrating the movement of the lower portion of the concentrated solar collector toward and away from a snap connector forming a portion of the locating connection.

With continued reference to FIG. 11, as noted above, with the pin 392 in the closed end 356 of the slot 354, the concentrator element 122 can be pivoted over the range of movement θ to thereby move the second connection element 304 toward the first connection element 302. As the second connection element 304 is moved into engagement with the leaf members 322, the inward projection portions 326 contact the outer surface of the reinforcing member 370, deflect outwardly, and then eventually snap into place with the protrusions 326 extending into the recesses 376 as illustrated in FIG. 5.

Additionally, as the reinforcing member 370 moves further toward the locating member 330, the lower surface 380 of the reinforcing member 370 contacts the upper surface 332 of the locating member 330 to thereby positively define the rotational position of the concentrator element 122. Finally, the projections 340 of the sidewalls 310 extend through the apertures 378 to thereby positively define a longitudinal alignment of the concentrator element 122 relative to the cross member 104. These engaging and contacting surfaces all independently and collectively provide locating functions.

Figure 12:
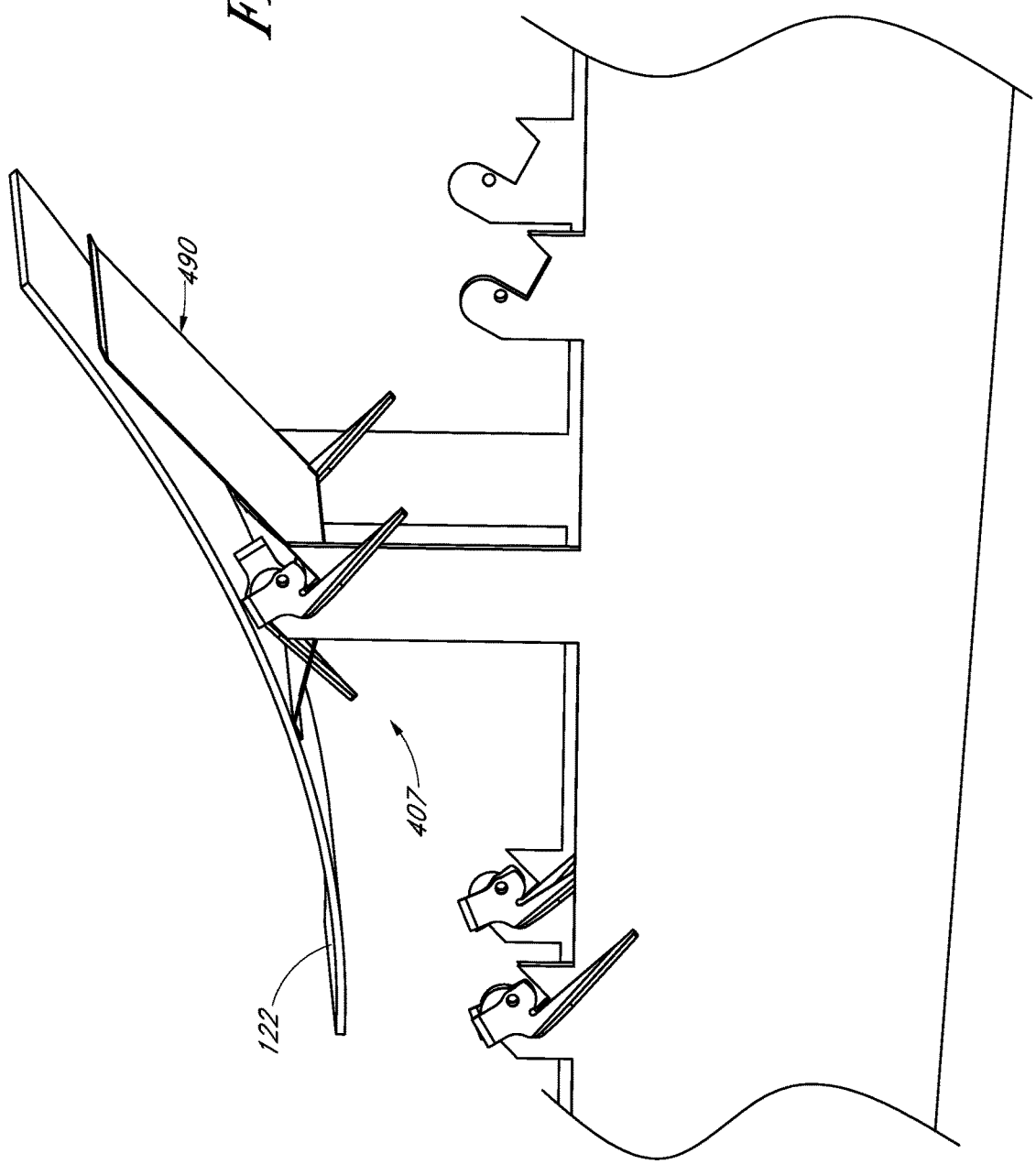
FIG. 12 is a perspective view of the solar concentrated array having a further embodiment of a connector.

With reference to FIG. 12, another embodiment of the locating connector 200 is identified by the reference numeral 400. Unless otherwise noted, the numerical indicator is used for identifying components of the tool-less connection 400. Refer to similar elements to those in FIGS. 1-11, except that the number has been increased by two hundred.

In the illustrated embodiment, the locating connector 400 is defined by a first connection portion 402 supported by the cross member 104 and a second connection element 404 which is defined, in an illustrated embodiment, by a stiffening member 490. The concentrating element 122 is removed from FIG. 13 merely for convenience of illustration. Additionally, it is to be noted that the locating connector 400 is described in the context of only a single connection between each lateral end of the concentrating element 122. However, it is to be understood that the additional locating connectors 400 can be used to connect the concentrating element 122 to the crossmember 104, for example, two connectors 400 on each longitudinal end of the concentrating element 122. Only one such connection is illustrated merely for convenience. Where two connectors 400 are disposed at each longitudinal end of the concentrating element 122, the connectors can have an arrangement corresponding to the staggered height reflected in FIGS. 12 and 13 and can face toward the same direction for ease of assembly.

Figure 13:
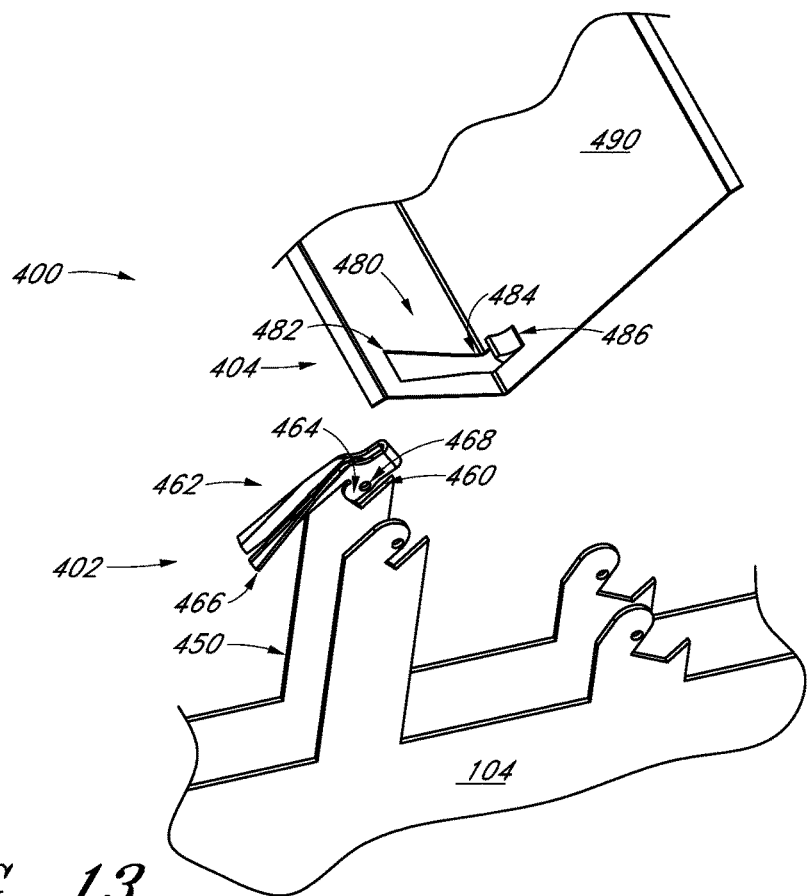
FIG. 13 is an exploded view of the connector illustrated in FIG. 12, with the mirror removed.
Figure 14:
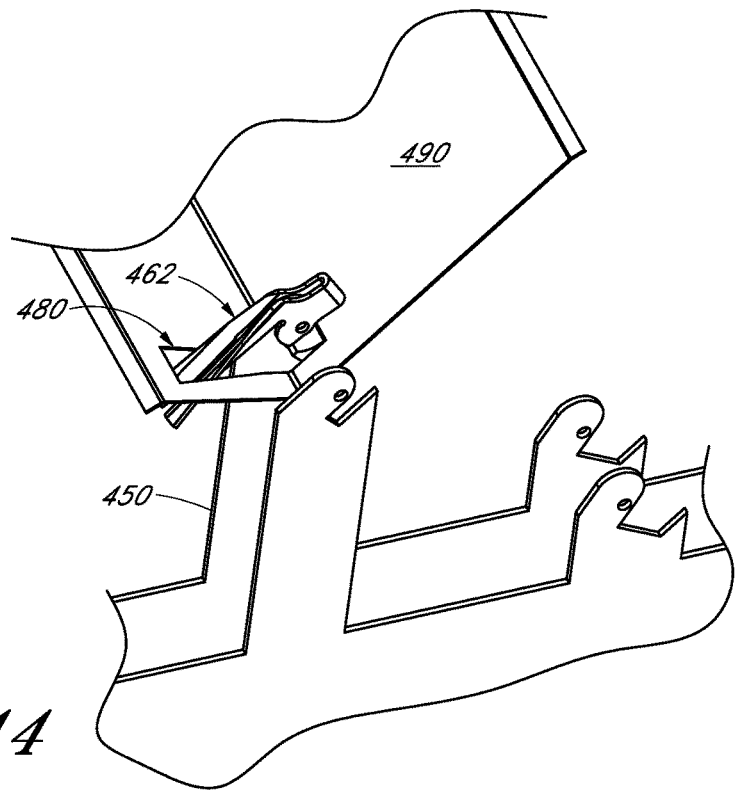
FIG. 14 is another perspective view of the connector illustrated in FIG. 12.
Figure 15:
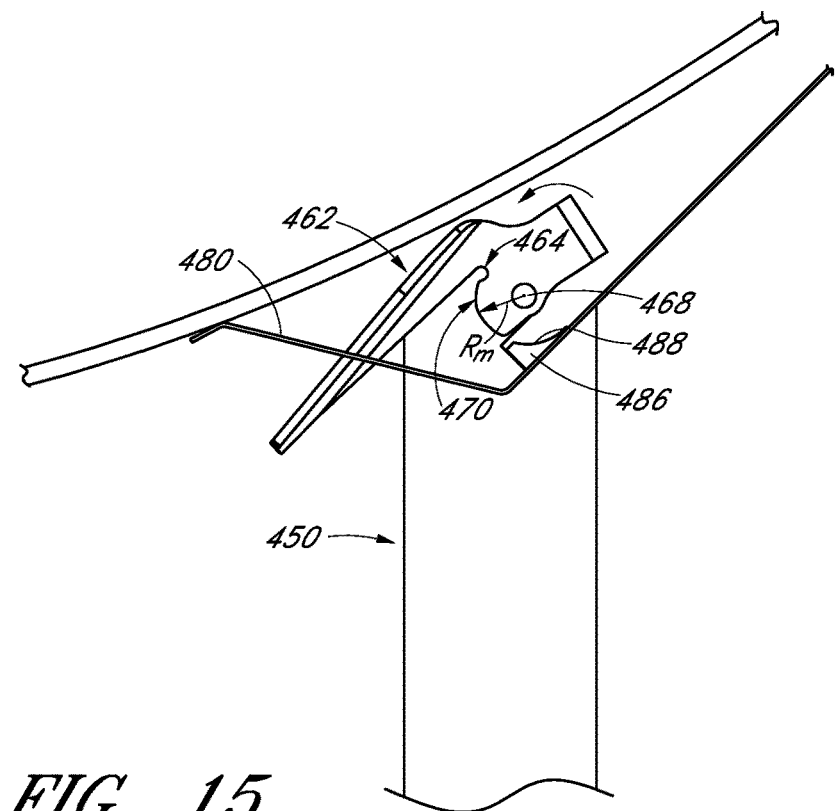
FIG. 15 is a side elevational view of the connector illustrated in FIG. 14, in an open state.
Figure 16:
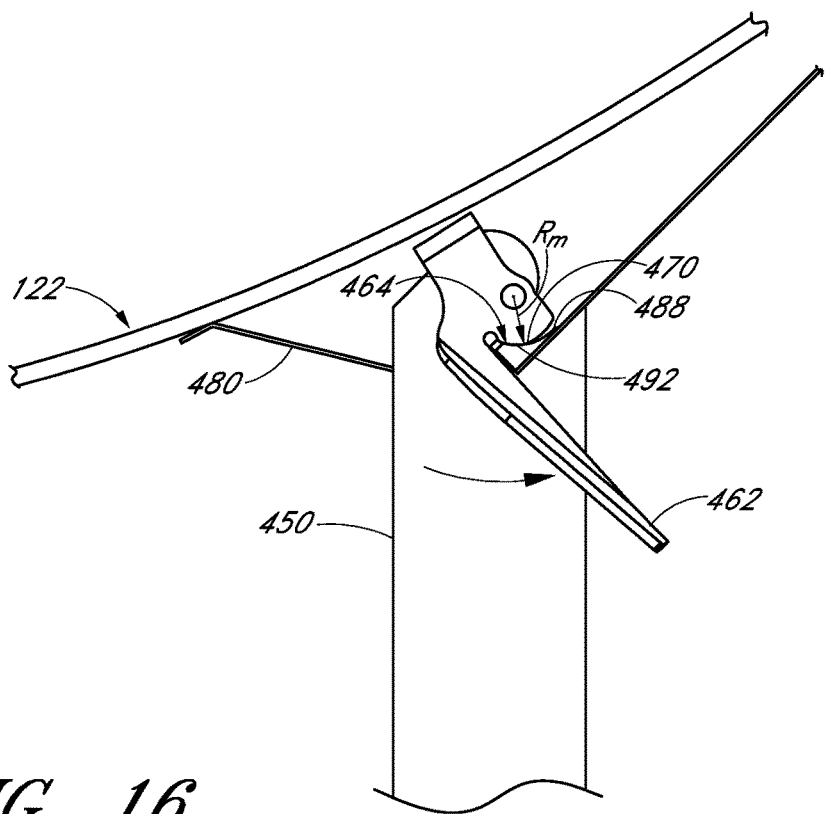
FIG. 16 is a further enlarged side elevational view of the connector illustrated in FIG. 15, in a closed state.

With reference to FIGS. 13-15, the first connection element 402 can include an upwardly extending support wall 450. An upper end of the support wall 450 can include a slot 460 for receiving a portion of the second connection element 404.

The first connection element can also include a cam member 462. The cam member 462 can include a camming surface 464, a lever handle 466, and a pivot 468. However, other configurations can also be used.

With reference to FIG. 15, the camming surface 464 can include a maximum radius portion 470 at which the camming surface 464 is disposed at the greatest radius $R_M$ from the pivot axis defined by the pivot 468. Thus, portions of the surface 464 adjacent to the point of maximum radius 470 are disposed at smaller radiuses from the pivot of 468.

In the illustrated embodiment, the cam member 462 is formed from a folded piece of structural sheet material, extending over the wall 450. The pivot 468 can be formed with any known device, such as a rivet, bolt, screw, or pin, etc.

The second connection element 404 can include a slot 480 defined in the stiffening member 490. In the illustrated embodiment, the slot 480 is V-shaped. As such, the slot 480 includes a wider upper end 482 and a narrower lower end 484. Additionally, the slot 480 includes an anchor portion 486 configured to engage the camming surface 464.

With reference to FIG. 14, as the stiffening member 490 is moved toward the cam lever device 462 the slot 480 can be passed over the cam lever device 462, as shown in FIG. 14. Additionally, the V-shaped configuration of the slot 480 cooperates with the wall 450 so as to more precisely define the relative position of the wall 450 relative to the stiffening member 490 because there is less clearance between the slot 480 and the wall 450 at the narrower lower end 484 of the slot 480. As such, the wall 450 and the slot 480 can provide a locating function.

Further, the anchor member 486 can be positioned in the slot 460 defined by the wall 450 when the slot is fully engaged with the wall 450, as illustrated in FIGS. 14 and 15. Optionally, the anchor member 486 can also provide a further locating function. For example, the anchor member 486 can be positioned such that it contacts the closed end of the slot 460 when the stiffening member 490 is moved into a position in which it is fully engaged with the slot 460.

With continued reference to FIG. 15, in this fully engaged position, the longitudinal position of the concentrator element 122 is defined by the cut edges of the wall for 450 and the slot 480. Additionally, as shown in FIG. 15, an upper surface 488 of the anchoring member 486 is curved to have a shape that is generally complementary to the curvature of the camming surface 464. In this position, the cam member 462 can be rotated in a counter clockwise direction, to thereby slide the camming surface 464 into engagement with the anchor member 486.

This configuration can provide additional benefits because, for example, but without limitation, two sheet metal components (e.g., the wall 450 and the stiffening member 490) are joined together in an orientation such that their major face planes are perpendicular. Both sheet components wall 450 and stiffening member 490 are cut (e.g., slots 460, 480) to accommodate the joining features. The wall 450 supports the cam member 462 rotating about a point that is above the v-shaped slot 480. The cam member 462 rotates about an axis that is perpendicular to the major face plane of the stiffening member 490. The v-shaped notch 480 has two faces that can serve as datums for locating the mating part, e.g., the wall 450. One datum (e.g., the lateral sides of the slot 480) positions the face plane of the stiffening member 490 and the other datum (the narrow end of the slot 480 or the anchor member 486) defines the stopping point of the movement of the stiffening member 490 into the slot 460. With two datums defining the position of the mating part, the part is constrained in two orthogonal directions. Other configurations can also be used to achieve such locating functions.

As noted above, as the cam member 462 is rotated to its full lock position, the contact patch between the camming surface 464 and the engaging surface 488 of the anchor member 486 is in an area identified by the reference numeral 492, which is adjacent to the point of maximum radius 470. Thus, the engagement between the cam member 462 and the anchor member 486 achieves an "over-center" engagement, thereby achieving a stable engagement. Further forces, such as wind, etc, applied to the concentrating element 122 will tend to further rotate the cam member 462 in a counterclockwise direction. As such, the concentrator element 122 remains securely engaged with the cross member 104.

Additionally, dimensions of the camming surface 464 and the engaging surface 488 of the anchor member 486 can be determined so as to provide further positively biased contact therebetween. For example, in some embodiments, these dimensions can be sized such that when the camming surface 464 rotates to the locked position, the pivot 468 and sheet metal components can deform, for example, elastically by a small amount, creating pressure on the end of the camming surface 464. The pressure on the end of the camming surface 464 forces the mating sheet metal of the stiffening member 490 against surfaces of the slot 460 and wall 450. Once the camming surface 464 rotates beyond its point of maximum radius 470, the pressure relaxes a small amount in the joint and the cam member 462 is stable in the closed position, but still maintains a positive pressing force between the camming surface 464 and the engaging surface 488. Optionally, additional features can be added to ensure that the cam member 462 does not move out of the locked position or rotate in the opposite direction.

FIG. 17 illustrates an engaged edge solar receiver 180 coupled to a portion of the cross beam 104, specifically to sidewalls 612 of the cross beam 104. Although one engagement is shown, additional edge solar receivers can be present beside, in the longitudinal direction, the edge solar receiver 180. Thus, the connection assembly shown can be replicated, including mirror images for symmetry, along the longitudinal directions, engaging the multiple edge solar receivers.

As used herein, "edge solar receiver" refers to solar receivers as described above and in further detail below. Some embodiments of solar receivers, can be coupled to the concentrator mirror component, whereas other embodiments, such as the edge solar receiver 180, can be coupled directly to the cross beam 104. This is because the edge solar receiver 180 can be positioned to receive concentrated sunlight from the outermost concentrator elements 126, 146 illustrated in FIG. 1. Consequently, an edge solar receiver can be positioned to receive the concentrated sunlight without requiring an additional concentrator element supporting it.

Figure 18:
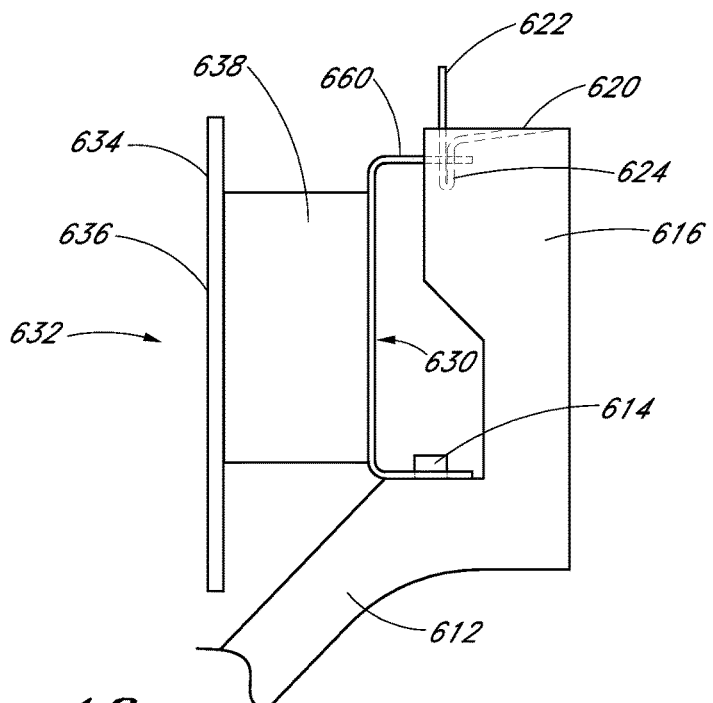
FIG. 18 is a side elevational view of the connector illustrated in FIG. 17.

With continued reference to FIGS. 17 and 18, certain features and components of the edge solar receiver 180 can differ from receivers which are coupled to mirrors, including the rear surface of the mirror. Unlike solar receivers mounted to a concentrator element, the edge solar receiver 180 can be supported by a frame component 660 which is coupled to edge sidewall 612. The edge sidewall 612 can have features and components as described in greater detail below.

All of the techniques and embodiments described above for connecting the concentrator element 122 to the cross beam 104 also can be employed for connecting the edge solar receiver 180 to the cross beam 104. Thus, while some particular embodiments are described in FIGS. 17-24, some embodiments of the edge solar receiver 180 and its connection to the cross beam can incorporate features of the connection techniques described with respect to FIGS. 3-16.

With reference to FIGS. 17-21, the edge solar receiver 180 can be coupled to the edge sidewall 612 along the rear side 630 of the edge solar receiver 180. The front side 632 of the edge solar receiver 180 can include a solar cell laminate 634. The laminate 634 can include a solar cell portion 636 comprising photovoltaic solar cells. In some embodiments, the photovoltaic solar cells can be back contact, back junction solar cells. In at least one embodiment, the solar cell portion 636 is comprised of fractional solar cells, such as halves or quarters of solar cells arranged in a strip. The solar cell portion 636 can be under a glass surface and surrounded by an encapsulant. The solar cell portion 636 can also include a backsheet. The entire solar cell laminate 634, comprising the solar cell portion 636, glass surface, encapsulant, and backsheet, can be affixed to a heat spreading element 638. The heat spreading element 638 can be a heat sink or head spreader, such as an extruded or folded fin heat sink. The heat spreading element 638 can in turn be supported by the frame component 660.

Figure 20:
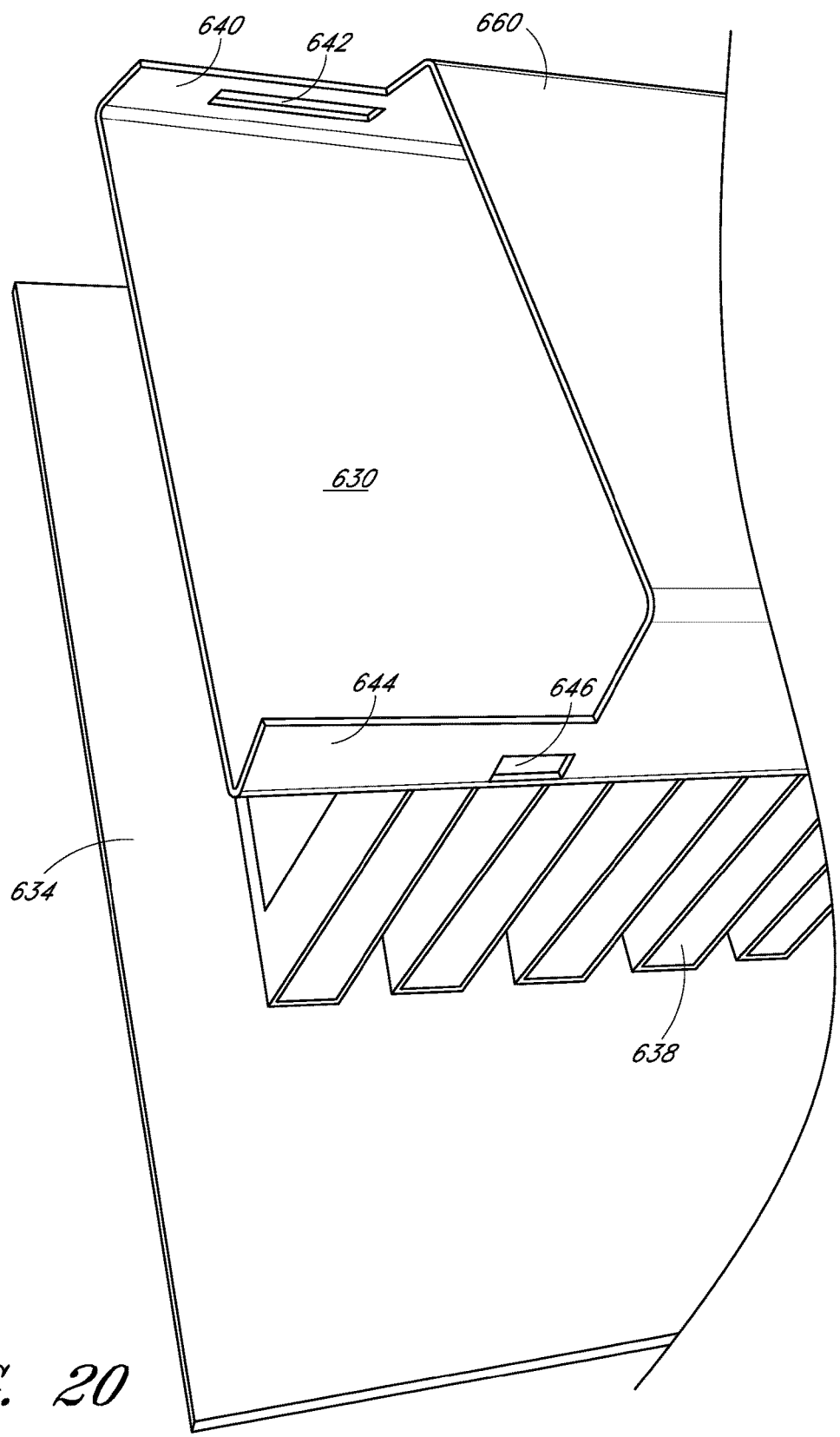
FIG. 20 is a rear perspective view of the edge receiver illustrated in FIG. 17.

With reference to FIG. 20, the frame component 660 can be a formed sheet of metal including punches or workings to form the features described. In some embodiments, the frame component 660 can be formed of an extruded metal, such as aluminum, or from a molded plastic, including blow- and injection-molded plastic components. In other embodiments, tubing of the desired cross-sectional shape can be used. In certain embodiments, the frame component 660 can be a stamped sheet of metal. The frame component 660 can be affixed to the heat spreading element 638 with a thermal paste adhesive having a high thermal conductivity to increase the effectiveness of the heat spreading element 638. In some embodiments, an adhesive or bonding agent without high thermal conductivity can be used. The frame component 660 can be a stiff object, supporting the other components coupled to it.

The frame component 660 can have two flanges, an upper flange 640 and a lower flange 642. The upper flange 640 can be formed by bent metal of the frame component 660 extending away from the heat spreading element 638. The upper flange 640 can have a wide slot 642 extending therethrough. The port or wide slot 642 can be located near an end of the frame component 660. The lower flange 644 can similarly have a notch slot 646 extending therethrough. The notch slot 646 can have a narrower size than the wide slot 642.

The frame component 660 can be releasably coupled to the cross beam 104 at the connecting portion 610 of the edge side wall 612. The connecting portion 610 can extend upward from the cross beam 104, either vertically or at an angle to the cross beam 104. A tab 614 can extend upward from a surface of the edge side wall 612. The tab 614 can have a rectangular shape and be sized in conjunction with the notch port or notch slot 646 such that when the tab 614 is positioned into the notch slot 646, the frame component 660 is constrained from horizontal motion, and disengaging the notch slot 646 can be accomplished by vertically separating the tab 614 from the notch slot 646.

The connecting portion 610 can include an upper portion 616 extending at an inclined angle to the rest of the edge side wall 612. The upper portion 616 can be angled to face downward toward the adjacent concentrator element. The upper portion 616 can include a biasing member 620, which can be cantilevered spring, discrete spring element, or snap fitting. The biasing member 620 can have a head portion 622 and a tab portion 624. When engaged, the head portion 622 can extend upward above the upper surface of the upper flange 640 when the tab portion 624 is positioned to extend into the wide slot 642, coupling the upper portion 616 to the frame component 660. This arrangement is shown in FIGS. 17 and 18. The head portion 622 can be moved to an open or disengaged position by manipulating it upward, removing the tab portion 624 from the wide slot 642.

Similar to the pivot arrangement described above, the frame component 660 can be tool-lessly engaged with the cross beam 104 by first inserting the tab 614 into the notch slot 646, then rotating the frame element 660 towards the biasing member 620 such that the tab portion 624 is lifted, then permitted to return to an engaged position inside the wide slot 642. In certain embodiments, the biasing member 620 can be formed such that it snap fits with the frame element 660. In this way, the frame component 660 is coupled to the connecting portion 610 of the edge side walls 612 in a self-locking arrangement such that the edge solar receiver 180 is arranged in a predetermined position. The edge solar receiver 180 can then be disengaged from the connecting portion 610 by withdrawing the tab portion 624 from the wide slot 642, then rotating the edge solar receiver 180 away from the connecting portion 610 and lifting the notch slot 646 from the tab 614.

It should be understood that although the biasing member 620 is illustrated as being a cantilevered element, a biasing device, such as a spring or any of the other connector types described above can similarly be used. Additionally, the tab 614 can have a variety of shapes and sizes, so long as it is engageable with the notch slot 646 or other connection feature along the lower flange 644.

Figure 19:
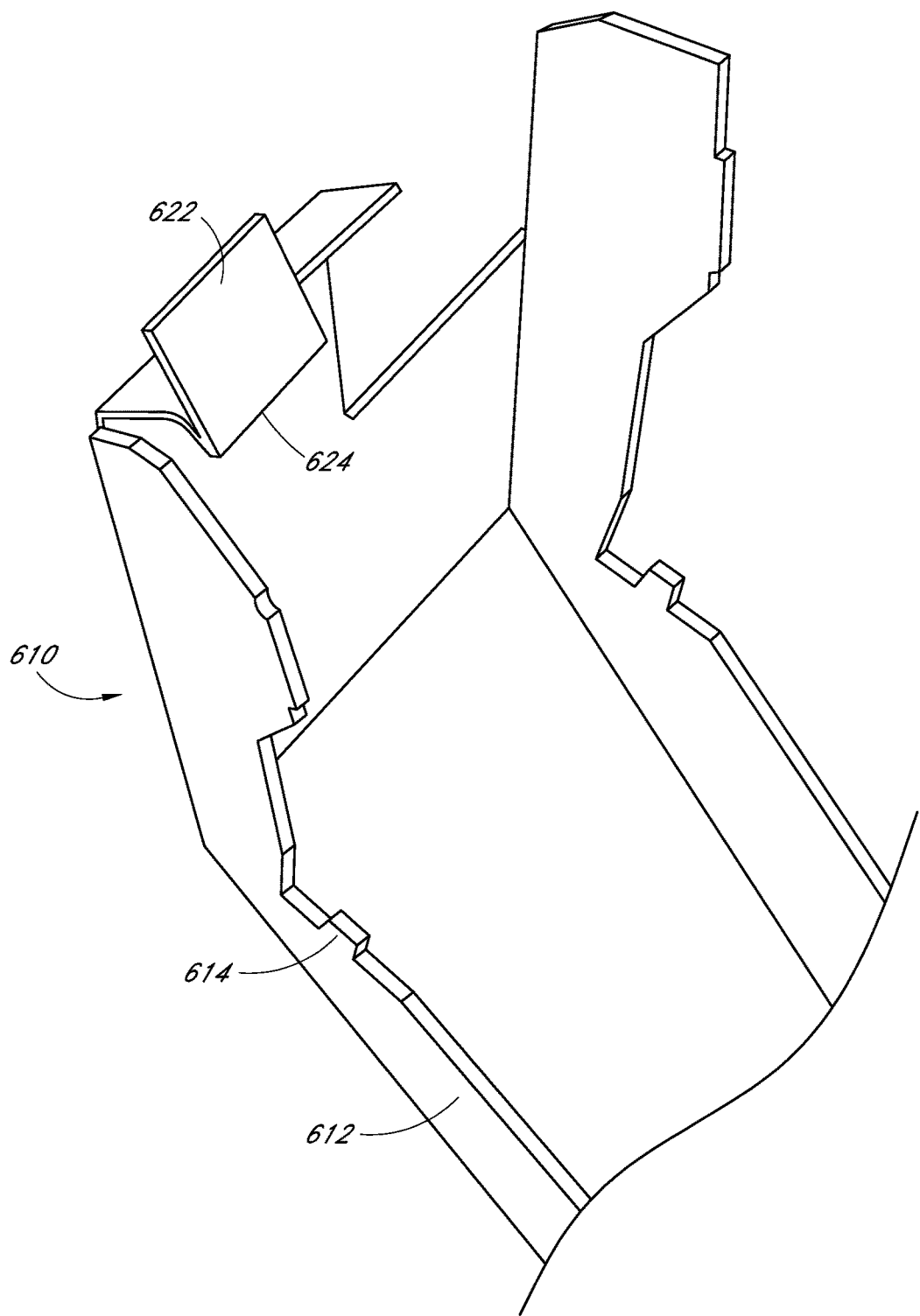
FIG. 19 is another perspective view of the connector illustrated in FIG. 18.

FIG. 19 illustrates an embodiment of the connecting portion 610 with the edge solar receiver 180 omitted for clarity. FIG. 20 illustrates a rear perspective view of the edge solar receiver 180 disengaged from the connecting portion 610. The edge solar receiver 180 can be connected to the connecting portion 610 with the tool-less connection to result in the engaged state illustrated in FIGS. 17 and 18. The frame supporting the connecting portion 610 can thus engaged the edge solar receiver 180 along the rear surface 630 of the edge solar receiver 180, positioning it to face one or more of the concentrating elements of the concentrator assembly 100.

Figure 21:
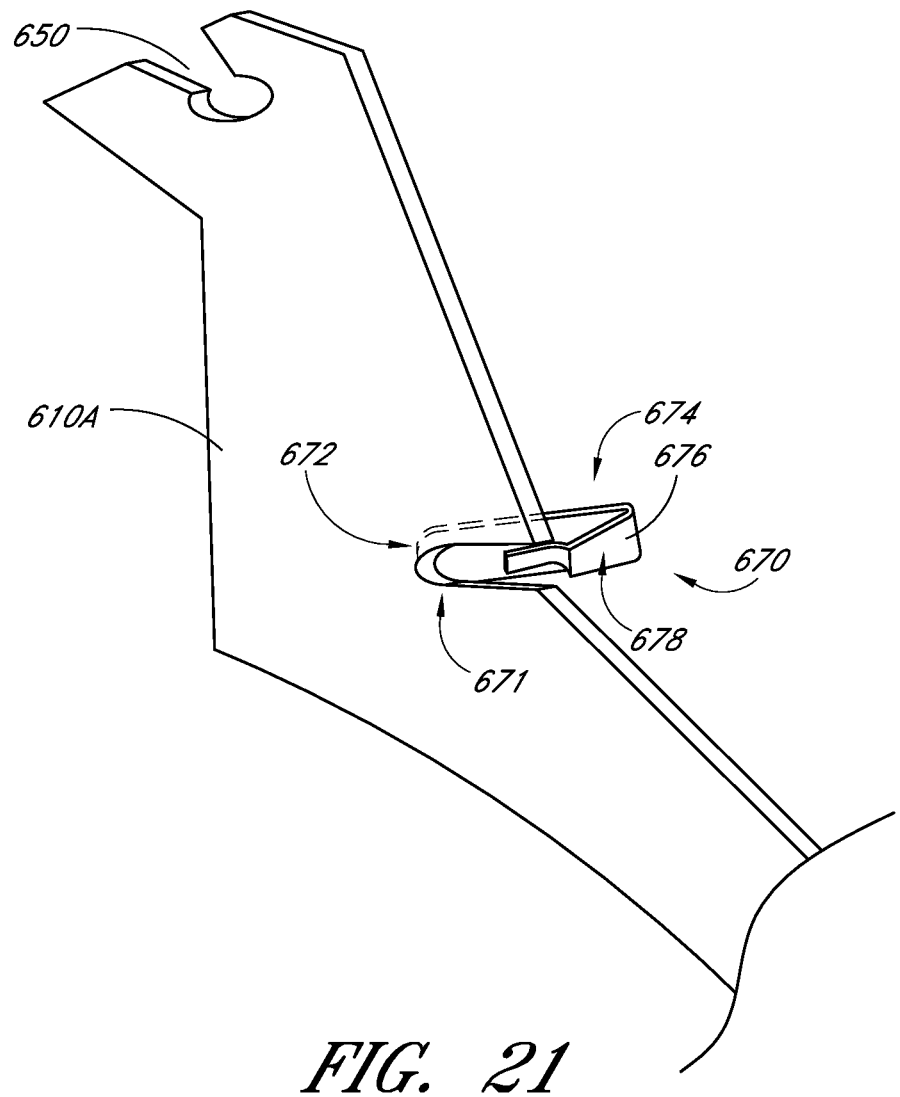
FIG. 21 is a front perspective view of another embodiment of a connector for an edge receiver.
Figure 22:
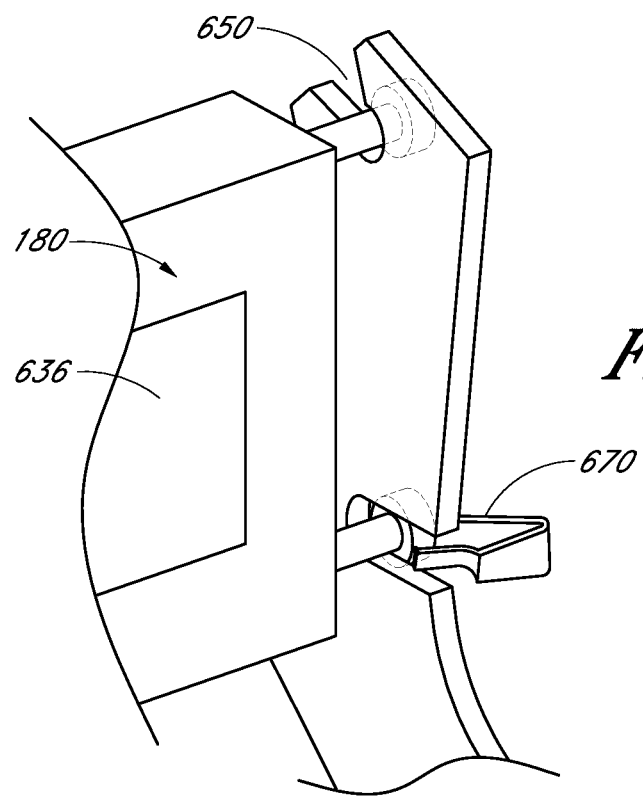
FIG. 22 is a front perspective view of the connector illustrated in FIG. 21.
Figure 23:
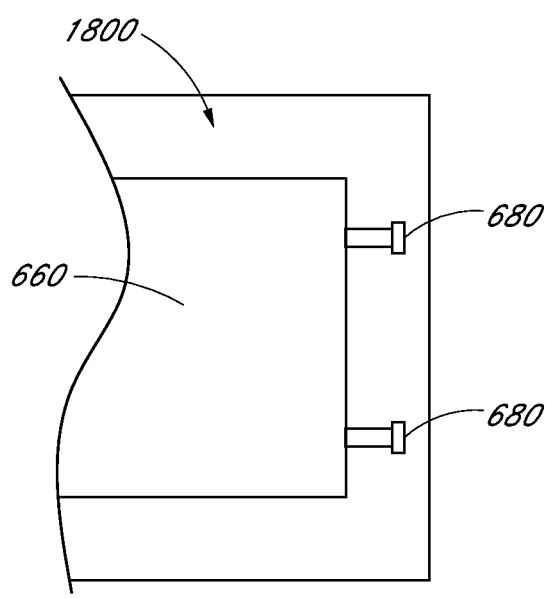
FIG. 23 is a rear elevational view of the edge receiver illustrated in FIG. 22.

Other embodiments of the edge solar receiver 180 and connecting portion 610 can have different engagement features. For example, as illustrated in FIGS. 21-23 and similar to the embodiments described above, the edge solar receiver

180 can have pin elements 680 which are mounted to the frame component 660. The pin elements 680 can be engaged to a connecting portion 610A at a slot 650 and slot engagement 671 with a biasing member 670. As described above, the pin element 680 introduced into the slot 650 can fit tightly in the closed end of the slot, providing a pivot location about which the edge solar receiver 180 can be rotated to engage the slot engagement 671 and captured by the biasing member 670.

Similarly to the embodiments described above with reference to FIGS. 4-11, the slot 650 can be formed with sufficient strength to support the entirety of the weight of the edge solar receiver 180. As such, a worker can hang the edge solar receiver 180 from two of the slots 650, inspect the edge solar receiver 180 to ensure proper alignment and connections with other components as well, such as for example, electrical connectors, then simply swing the edge solar receiver 180 into its locked position when appropriate.

The biasing member can have any configuration. In certain embodiments, the biasing member 670 can include a first end 672 fixed to a wall of the connecting portion 610A, a cantilever body portion 674, and a distal end 676 which can have a barbed configuration, configured for achieving a locked position (FIG. 21) in which the lower pin 680 is captured in the lower slot 671.

Optionally, the distal end 676 can have a ramp-shaped outer face 678 which can be configured to make the locking movement smoother. For example, as the lower pin 680 is moved toward the ramp-shaped outer surface 678, the interaction between the ramp-shaped face 678 and the lower pin 680 causes the distal end 676 of the biasing member 670 to bend outwardly. Then, as the pin 680 is moved further inwardly, the pin passes the distal end 676, then snaps back to its resting position in which the lower pin 680 is captured in the slot 671. However, other configurations can also be used.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solar collection system comprising:
   a frame;
   a solar collection device supported by the frame;
   a connection device connecting the solar collection device to the frame; and
   a pivot mount configured to guide the solar collection device through a pivoting motion about a pivot axis, between a disconnected state in which the connection device is not in an engaged state and in which the solar collection device can be rotated about the pivot axis and a second connected state in which the connection device inhibits movement of the solar collection device through the pivoting motion, wherein
   the connection device includes at least one tool-less connection, and
   the tool-less connection includes a snap fitting having a first portion fixed to the solar collection device and a second portion fixed to the frame.

2. The solar collection system of claim 1, wherein the solar collection device comprises a mirror.

3. The solar collection system of claim 1, wherein the solar collection device comprises a solar receiver.

4. The solar collection system of claim 1, wherein the frame comprises a torque tube extending along a longitudinal axis and being supported above the ground for rotational movement about the longitudinal axis of the torque tube.

5. The solar collection system of claim 4, further wherein the solar collection device comprises a first plurality of mirrors on the frame on a first side of the torque tube and a second plurality of mirrors on the frame on a second side of the torque tube.

6. The solar collection system of claim 5, wherein each of the first plurality of mirrors and the second plurality of mirrors comprises a reflective surface that faces away from the torque tube.

7. The solar collection system of claim 1, wherein, in the second connected state, the connection device comprises a snap fitting to inhibit movement of the solar collection device through the pivoting motion.

8. The solar collection system of claim 1, wherein the tool-less connection comprises at least one cam member that is configured to rotate between an open and a locked position, wherein in the locked position, the cam member achieves an over-center state with a positive pressing force against a mating surface so as to secure the solar collection device to the frame.

9. A solar collection system comprising:
   a frame that includes a torque tube extending along a longitudinal axis, the frame being supported above the ground for rotational movement about the longitudinal axis of the torque tube;
   at least one edge solar receiver supported by the frame;
   at least one connection device connecting the at least one edge solar receiver to the frame, the connection device comprising at least one tool-less connection connecting the edge solar receiver to the frame when the tool-less connection is in an engaged state; and
   a first plurality of mirrors on the frame on a first side of the torque tube and a second plurality of mirrors on the frame on a second side of the torque tube.

10. The solar collection system of claim 9, wherein the tool-less connection is configured to move from a disengaged state to the engaged state at least by pivoting the at least one edge solar receiver relative to a portion of the frame.

11. The solar collection system of claim 9, wherein the at least one edge solar receiver is disposed on the first side of the torque tube at a position farther from the torque tube than an outermost mirror of the first plurality of mirrors.

12. The solar collection system of claim 11, wherein the outermost mirror faces away from the torque tube so as to reflect sunlight onto the at least one edge solar receiver.

13. A solar collection system comprising:
   a frame configured to rotate about an axis;
   a plurality of concentrator elements supported by the frame on a first side of the axis, each of the plurality of concentrator elements having a reflective surface facing in generally the same direction, the plurality of concentrator elements spaced apart on the frame along a direction transverse to the axis;
   a solar receiver disposed on the first side of the axis; and at least one connection device connecting at least one of the solar receiver and a first concentrator element of the plurality of concentrator elements to the frame, the at least one connection device comprising at least one tool-less connection connecting the at least one of the solar receiver and the first concentrator element to the frame when the tool-less connection is in an engaged state, wherein the at least one tool-less connection is configured to move from a disengaged state to the engaged state at least by pivoting the at least one of the solar receiver and the first concentrator element relative to a portion of the frame.

14. The solar collection system of claim 13, wherein the at least one connection device connects the solar receiver to the frame, the solar receiver disposed on the first side of the axis at a position farther from the axis than an outermost concentrator element of the plurality of concentrator elements.

15. The solar collection system of claim 14, wherein the outermost concentrator element faces away from the axis so as to reflect sunlight onto the solar receiver.

\* \* \* \* \*